(12) United States Patent
Noel et al.

(10) Patent No.: US 8,810,974 B2
(45) Date of Patent: Aug. 19, 2014

(54) MAGNETIC SENSOR STACK BODY, METHOD OF FORMING THE SAME, FILM FORMATION CONTROL PROGRAM, AND RECORDING MEDIUM

(75) Inventors: Abarra Einstein Noel, Hachioji (JP); Masahiro Suenaga, Tama (JP); Yoshinori Ota, Tama (JP); Tetsuya Endo, Komae (JP)

(73) Assignee: Canon Anelva Corporation, Kawasaki-shi (JP)

( * ) Notice: Subject to any disclaimer, the term of this patent is extended or adjusted under 35 U.S.C. 154(b) by 415 days.

(21) Appl. No.: 12/849,907

(22) Filed: Aug. 4, 2010

(65) Prior Publication Data

US 2011/0032645 A1 Feb. 10, 2011

(30) Foreign Application Priority Data

Aug. 4, 2009 (JP) .................................. 2009-181479
Sep. 25, 2009 (JP) .................................. 2009-219943
Jun. 30, 2010 (JP) .................................. 2010-149407

(51) Int. Cl.
*G11B 5/39* (2006.01)
*G11B 5/31* (2006.01)
*H01L 43/08* (2006.01)
*H01L 43/12* (2006.01)
*G01R 33/09* (2006.01)

(52) U.S. Cl.
CPC ............ *G11B 5/3932* (2013.01); *G11B 5/3163* (2013.01); *H01L 43/08* (2013.01); *H01L 43/12* (2013.01); *G11B 5/398* (2013.01); *G01R 33/098* (2013.01)
USPC ...................... 360/327.1; 360/324; 360/327.2

(58) Field of Classification Search
USPC .............. 360/324, 326, 327.1, 327.2, 327.23, 360/327.3, 327.31
See application file for complete search history.

(56) References Cited

U.S. PATENT DOCUMENTS

| 5,739,990 | A | 4/1998 | Ravipati et al. |
| 6,139,906 | A | 10/2000 | Hegde et al. .................. 427/125 |
| 6,656,604 | B2 * | 12/2003 | Hasewaga ..................... 428/611 |
| 6,839,205 | B2 | 1/2005 | Kagami et al. |
| 7,061,731 | B2 * | 6/2006 | Larson et al. ............ 360/324.12 |
| 7,115,119 | B2 | 10/2006 | Desarzens ......................... 606/1 |
| 7,123,451 | B2 * | 10/2006 | Sbiaa et al. ................... 360/322 |

(Continued)

FOREIGN PATENT DOCUMENTS

| JP | 2003-060262 A | 2/2003 |
| JP | 2004-119534 A | 4/2004 |
| JP | 2009-087474 A | 4/2009 |

*Primary Examiner* — Brian Miller
*Assistant Examiner* — Carlos E Garcia
(74) *Attorney, Agent, or Firm* — Fitzpatrick, Cella, Harper & Scinto

(57) ABSTRACT

The present invention is directed to align crystal c-axes in magnetic layers near two opposed junction wall faces of a magnetoresistive element so as to be almost perpendicular to the junction wall faces. A magnetic sensor stack body has, on a substrate, a magnetoresistive element whose electric resistance fluctuates when a bias magnetic field is applied and, on sides of opposed junction wall faces of the magnetoresistive element, field regions including magnetic layers for applying the bias magnetic field to the element. The magnetoresistive element has at least a ferromagnetic stack on a part of an antiferromagnetic layer, and width of an uppermost face of the ferromagnetic stack along a direction in which the junction wall faces are opposed to each other is smaller than width of an uppermost face of the antiferromagnetic layer in the same direction.

30 Claims, 26 Drawing Sheets

(56) References Cited

U.S. PATENT DOCUMENTS

| | | | |
|---|---|---|---|
| 7,161,763 B2 | 1/2007 | Ho et al. ................... 360/97.02 |
| 7,177,121 B2 | 2/2007 | Kojima et al. |
| 7,360,300 B2 | 4/2008 | Carey et al. ................ 29/603.16 |
| 2001/0038927 A1* | 11/2001 | Hasewaga ..................... 428/692 |
| 2002/0024775 A1* | 2/2002 | Hasegawa ...................... 360/314 |
| 2003/0030947 A1* | 2/2003 | Ooshima ................. 360/324.12 |
| 2003/0039080 A1 | 2/2003 | Kagami et al. |
| 2003/0048585 A1* | 3/2003 | Gill .......................... 360/324.12 |
| 2004/0114284 A1* | 6/2004 | Rachid et al. ............ 360/324.11 |
| 2004/0145836 A1 | 7/2004 | Kojima et al. |
| 2007/0115595 A1* | 5/2007 | Honda et al. .................. 360/320 |
| 2007/0253117 A1 | 11/2007 | Takei et al. |
| 2008/0117552 A1* | 5/2008 | Zhou et al. .................... 360/319 |
| 2008/0273274 A1* | 11/2008 | Kojima et al. ................ 360/315 |

* cited by examiner

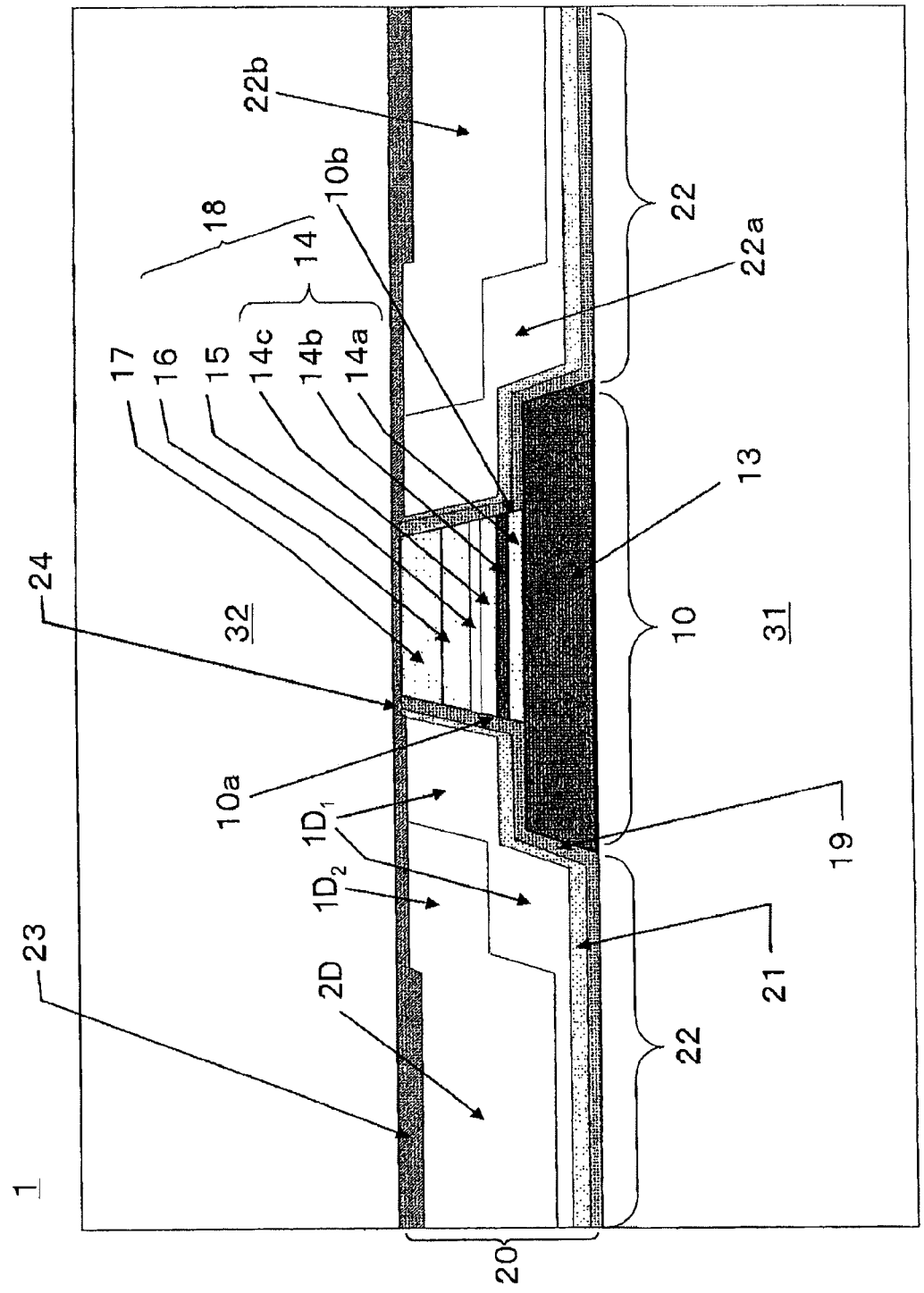

ETCHING LINES

MAGNETIC SENSOR STACK BODY, METHOD OF FORMING THE SAME, FILM FORMATION CONTROL PROGRAM, AND RECORDING MEDIUM

BACKGROUND OF THE INVENTION

1. Field of the Invention

The present invention relates to a magnetic sensor stack body having magnetic layers for applying bias magnetic fields on both sides of a magnetoresistive element (reader stack), and a method of forming the same.

2. Description of the Related Art

As the capacity of a hard disk drive (HDD) increases in recent years, attention is being paid to a magnetoresistive (MR) head using an element whose electric resistance changes according to fluctuations in external magnetic fields. Particularly, the sensitivity of a giant magnetoresistive (GMR) head and a tunnel magnetoresistive (TMR) head is very high, so that recording density of a magnetic disk can be increased. Further, as recording density becomes higher, miniaturization of an MR head is being promoted.

An MR head has an MR element (reader stack) whose two side surfaces are surrounded by magnetic layers which provide a biasing magnetic field. When the reader stack thickness is reduced, the space which can be used by the magnetic layer for applying a bias magnetic field is also reduced. When the volume of the magnetic layer and the area of a surface facing an end of the reader stack is reduced, the bias magnetic field also decreases.

The surface area facing the reader stack is deter-mined by a read gap (distance between two shields surrounding a magnetic tunnel junction (MTJ) or giant magnetoresistive (GMR) stack layer) and stripe height (horizontal dimension of the reader stack perpendicular to the surface of a recording medium). Reduction in the read gap is necessary to increase resolution of magnetic bits on a track in recording media. Both the reader width and stripe height are also reduced to decrease reader sensitivity to magnetic bit track edges.

The areal density of a hard disk drive (HDD) is increased by scaling the magnetic bits on the recording medium and the size of the read and write components. Improvements in signal processing or error correction codes also lead to areal density increases. To further decrease the bit size in a recording medium, that is, to increase density in track/inch (TPI) and bit/inch (BPI) as units, the average diameter and size distribution need to be reduced. To record information in a smaller magnetic region and to read information from a smaller magnetic region, both the writer and the reader are scaled down in size. In particular, to increase resolution and achieve recording at higher BPI, the distance between shields is decreased; to increase TPI, the reader width is narrowed.

A typical sensor structure includes an antiferromagnetic (AFM) pinning layer, a synthetic antiferromagnetic layer (SAF), a nonmagnetic spacer or a tunnel insulator, and a ferromagnetic free layer. A seed layer and a capping layer are also used for various purposes. The SAF is made of two ferromagnetic members coupled in opposite directions via a thin spacer layer. The ferromagnetic member in the SAF includes a pinned layer which is in contact with the AFM layer and a reference layer which is in contact with the nonmagnetic spacer or the tunnel insulator. A resistance change via the reader stack is determined by relative directions of magnetizations between the reference layer and the free layer. A magnetic field is applied to the free layer, such that the free layer is "biased" and oriented to form a right angle with the reference layer. With such configuration, reading sensitivity is high, and a linear response is obtained to an external magnetic field from a recording medium. The bias magnetic field comes from permanent magnets formed on the sides of the reader. The permanent magnets are also referred to as "hard bias". The biasing field must be maintained throughout the life of a disk drive. The hard bias also has a role of preventing the creation of magnetic domains in the free layer. Both of the magnetoresistive element and the hard bias stack body are sandwiched by two thick soft magnetic shields.

A simple hard bias stack body includes an underlayer made of Cr, W, or the like, a magnetic layer made of CoPt, CoCrPt, or the like, and a capping layer made of Cr, Ru, Ta, or the like. To prevent switching caused by an external magnetic field at particularly high operation temperature, the coercive force (Hc) of the magnetic layer is desired to be equal to or higher than 159.5 kA/m (2000 oersted (Oe)).

When magnetization reversal occurs in a part of magnetic layer crystal grains, there is the possibility that remarkable decrease in the bias magnetic field is caused, and noise in a sensor is induced. Reduction in the read gap size leads to decrease in thickness of the hard bias stack body which can be applied between shields. Since the bias magnetic field is proportional to the product (Mrt) between residual magnetization of the magnetic layer and thickness, when the thickness "t" decreases, application of bias to the free layer may become insufficient. Further, when the magnetic layer and the shield layer become close to each other, a leakage magnetic flux to the shield layer increases, and the bias magnetic field in the junction wall face (the border between the reader stack and the hard bias stack body) further decreases.

One of methods of increasing the magnetic field is to decrease the thickness of the insulating layer that insulates the magnetic layer from the free layer in the junction wall face. However, since a low leak current and a high breakdown voltage are requested, there is a limit to decrease the thickness of the insulator. The magnetic layer can be made of an insulating material such as ferrite. By making the magnetic layer of an insulating material, the insulating layer may not be provided, or the thickness of the insulating layer can be decreased to 3 nm or less. However, there is a tendency that saturated magnetizations and coercive forces of most of insulating magnetic ferrites are inferior to those of Co—Pt alloys. It is much difficult to control the compositions and crystal growth of the ferrites.

The present CoPt-based hard bias stack body has two-dimensional isotropy. In a plane, the coercive forces Hc along any directions are equal. That is, OR (orientation ratio, that is, the ratio between coercive force in an in-plane perpendicular direction with respect to the stripe height and coercive force in the stripe height direction) indicative of magnitude of magnetic anisotropy is equal to 1. Hexagonal crystal c-axes of CoPt are at random in a plane. However, by exchange coupling of a number of crystal grains, a relatively high squareness ratio (0.85 or higher) can be realized. On the junction wall face, an average magnetic field is directed toward the free layer. When the stripe height decreases, the crystal grains in the junction wall face decrease, so that it becomes more difficult to direct the magnetic flux toward the free layer. This phenomenon is conspicuous when the c-axes of the crystal grains are not oriented to the free layer. If the c-axes can be oriented toward the junction wall face, the ratio of the stripe height (depth) to the crystal grain diameter is not a matter. Further, Mr to the same thickness "t" increases, and a higher bias magnetic field can be obtained. A larger number of magnetic fluxes are condensed on the junction wall face, and the magnetic fluxes which are lost at side ends of the hard bias stack body decrease.

When viewed from the air bearing surface (hereinbelow, called "ABS"), the width of the entire reading apparatus is perpendicular to recorded tracks, and thickness is parallel to the tracks. The reading apparatus extends perpendicular to the ABS and, apart from the ABS, extends to a height called stripe height (depth). The three-dimensional sizes of the reading apparatus are determined by the width of the reading apparatus, thickness of the stack body, and the stripe height. The optimum stripe height to a given width is usually smaller than 1.5 times of the width. As described above, a number of Layers constructing the reading apparatus exist and, by the layers, the minimum value of a thickness which can be obtained is regulated.

For example, when the AFM layer is formed too thinly, the layer becomes thermally unstable, and the magnetization direction of a pinned layer of SAF cannot be sufficiently pinned. That is, exchange biases decrease. Further, when the dimension in the horizontal direction decreases, the dimensional effect becomes thermally limited, and an adverse influence is exerted on stability of the reading apparatus. With respect to an Ir—Mn alloy generally used, it is considered that crystal grains in a major part have a proper dimension (30 nm or larger). When the thickness is proper (5 nm or larger), the dimension in the horizontal direction larger than 50 nm does not become a matter. Therefore, if the AFM layer is not single crystal, unstable crystal grains tend to be formed in the apparatus.

A Cr seed layer is grown in a (110) lattice plane. From the studies of OR in longitudinal media, OR>1 is achieved only in the case of a Cr (002) lattice plane. A CoPt (1120) is formed on it. With respect to the epitaxial relations between the [110]direction and [1-10] direction, for CoPt (in the (1120) lattice plane, the lattice constant in the c-axis direction is 0.41 nm, and that of a lattice axis perpendicular to the c-axis is 0.43 nm), it is equivalent in energy. Only in the case where a Cr lattice is deformed in a plane due to an anisotropic stress, a specific direction is desired. Simions et al. (refer to U.S. Pat. No. 6,185,081) propose different seed layers made of MgO, NiAl, and the like. In study of recording media, it was proven that both underlayers provide two-dimensional c-axis alignment.

Larson et al. (refer to U.S. Pat. No. 7,061,731) disclose a read sensor having a magnetoresistive element having high magnetic anisotropy toward a device junction wall. San Ho et al. (refer to U.S. Pat. No. 7,161,763) clarifies the possibility that the c-axis direction is limited by an angle of an HCP magnetic bias stack body. That is, both of the specifications disclose that magnetic anisotropy can be realized by formation of a film of CoPt alloy using oblique sputtering. Oblique sputtering is, although the most proper Hc OR is less than 1.2, used by Shibamoto et al. (refer to U.S. Pat. No. 7,115,119) also at the time of giving orientation to a longitudinal medium. An Nb nitride or Ta nitride seed layer (anisotropy permissible layer) of an early date is obliquely deposited to obtain magnetic anisotropy of a medium along the circumferential direction in a rigid circular disk.

In-plane anisotropy of a soft layer of FeCo or the like can be easily realized by oblique sputtering. Particularly, in a sputtering process having a high incidence angle to normal of a film formation face, in-plane anisotropy occurs even in a relatively thin film (about 10 nm) by the self shadow effect. The self shadow effect denotes that a shadow is created by nucleus generated on the surface of an oblique incidence deposition film and, since sputter particles do no fly in the shadow portion, the film grows in an oblique column shape. In our experience, in a CoPt layer having an optimum thickness (about 20 nm), dependency of in-plane anisotropy on the incident angle is low, so that a seed layer or an underlayer has to be thickened. However, a seed layer has to be thin (6 nm or less), and it makes very difficult to form a hard bias stack film according to a result of study of Larson et al. and San Ho et al. San Ho et al. suggests that a magnetic layer has a (11-20) lattice plane to show OR of a certain degree. In evaluation by an XRD (X-ray diffractiometer), a (10-10) lattice plane is shown. This is a typical case of low-temperature film formation (less than 100° C.). Film formation at higher temperature brings about, for example, (002) growth for Cr, but the growth is limited in the presence of a temperature-sensitive photoresist mask in hard bias deposition. A dominant lattice plane of a medium disclosed by Shibamoto et al. is expected to be CoCrPtB (1120) for high-temperature deposition of a layer. Further, an obliquely deposited underlayer does not display the (002) plane which is considered to be necessary to induce the OR in a longitudinal recording medium (Mirzamaani). As suggested by the concept of Larson et al., the hard bias OR is induced by probably anisotropy caused by exchange coupling. "Mrt" is the largest along a direction in which the exchange coupling is the maximum. It is considered that OR is induced by a wavy surface pattern (anisotropy roughness by Carey et al. (refer to U.S. Pat. No. 7,360,300)).

The present hard bias deposition is performed mostly by the long throw sputtering such as ion beam deposition (IBD). An IBD system has a stage which is rotatable to adjust the incidence angle of an incident sputter particle. For example, Hegde et al. (refer to U.S. Pat. No. 6,139,906) disclose methods of depositing hard bias films. A magnetic layer is deposited at an almost perpendicular angle (25 degrees or less from the perpendicular line).

To realize a thinner CoPt layer, in addition to difficulty to obtain sufficient OR, there is a porous film generated by oblique sputtering exceeding 45 degrees from the perpendicular line. It can be observed in, for example, an image of Larson et al. Therefore, the magnetic moment decreases as the density decreases. Decrease in the magnetic moment can also cancel out acquisition of any magnetic rectangular property achieved by combining directions of magnetic anisotropy (Mr/Ms).

SUMMARY OF THE INVENTION

To reduce problems of decrease in OR depending on the incident angle of deposition of a magnetic layer and a thick underlayer and a thick seed layer required to obtain sufficient OR, an optimum method for condensing magnetic fluxes to a junction wall face is necessary.

FIGS. 26 and 27 are outline drawings each showing a profile perpendicular to a stack direction of a conventional magnetic sensor stack body. Arrow 92 indicates the magnetization directions of magnetic particles after the hard bias stack body is magnetized. By the magnetization, a bias magnetic field is generated to the right direction in a free layer (in FIG. 26) of a reader stack 90. The crystal c-axis directions in the magnetic layer are distributed at random two-dimensionally in a plane.

By using exchange coupling, adjacent magnetizations are oriented more parallel to each other. By miniaturization of crystal particles or extension of the stripe height (depth) "h" (refer to FIG. 26), an average value of the magnetization directions in the junction wall face becomes sufficiently large, and a magnetic field which is relatively uniform can be generated in the entire free layer. On the other hand, when the number of crystal particles is small and the area of the free layer is small (FIG. 27), due to the influence of directions of anisotropy of crystal particles, uniformity of magnetization in the reader stack 90 deteriorates. Nonuniformity of magnetic fields causes noise in a read head.

To promote reduction in an MR element, it is sufficient to make the crystal c-axes in the magnetic layer of the hard bias stack body oriented almost perpendicular to the junction wall face between the reader stack and the hard bias stack body so as to condense the magnetic fluxes to the junction wall face. In other words, it is sufficient to make the crystal c-axes oriented in a direction along the ABS as a surface facing a magnetic recording medium (FIGS. 2 and 13).

An object of the present invention is to provide a magnetic sensor stack body in which c-axes in a magnetic layer near a junction wall face of a reader stack are oriented almost perpendicular to the junction wall face and magnetic fluxes can be condensed to the junction wall face, and a method of forming the same.

The configurations of the present invention made to achieve the object are as follows.

As described above, in the first aspect of the invention, the magnetic sensor stack body includes, on a substrate, a magnetoresistive element whose electric resistance fluctuates when a bias magnetic field is applied and, on sides of opposed junction wall faces of the magnetoresistive element, field regions including magnetic layers for applying the bias magnetic field to the element. In the magnetic sensor stack body, wherein the magnetoresistive element has at least a ferromagnetic stack on a part of an antiferromagnetic layer, and width of an uppermost face of the ferromagnetic stack along a direction in which the junction wall faces are opposed to each other is smaller than width of an uppermost face of the antiferromagnetic layer in the same direction.

On the other hand, in the first aspect of the invention, the method of forming a magnetic sensor stack body includes, on a substrate, a stepwise-shaped magnetoresistive element having at least a ferromagnetic stack on a part of an antiferromagnetic layer and, in field regions on sides of opposed two junction wall faces of the magnetoresistive element, a hard bias stack body for applying a bias magnetic field to the element. The method includes the steps of: forming the antiferromagnetic layer and the ferromagnetic stack on the substrate; forming a pattern of a photoresist mask on the ferromagnetic stack; etching a part of the ferromagnetic stack; trimming the photoresist mask in a width direction; forming the stepwise-shaped magnetoresistive element by etching the ferromagnetic stack and the antiferromagnetic layer using the trimmed photoresist mask; forming a hard bias stack body in the field region; and planarizing the surface of the stepwise-shape magnetoresistive element and the hard bias stack body.

That is, in the second aspect of the invention, the magnetic sensor stack body includes, on a substrate, a magnetoresistive element whose electric resistance fluctuates when a bias magnetic field is applied and, on sides of opposed junction wall faces of the magnetoresistive element, field regions including a magnetic layer for applying the bias magnetic field to the element. In the magnetic sensor stack body, at least an underlayer having a body-centered cubic crystal structure (bcc) is provided on the field region, the magnetic layer is formed on the underlayer, and the magnetic layer is made of a Co—Pt-based alloy having a hexagonal crystal structure (hcp), has no gaps in the layer, has a (10.0) lattice plane, and a squareness ratio exceeding 0.9 along ABS.

In addition, in the second aspect of the present invention, the method of forming a magnetic sensor stack body includes, on a substrate, a magnetoresistive element whose electric resistance fluctuates when a bias magnetic field is applied and, in field regions on sides of opposed two junction wall faces of the magnetoresistive element, forming a hard bias stack body for applying a bias magnetic field to the element. The method includes at least the steps of: obliquely forming an underlayer along a direction of the junction wall faces at a film forming angle exceeding 45 degrees and less than 90 degrees from a normal of the substrate; and forming a magnetic layer on the underlayer at a film forming angle of 0 to 30 degrees from the normal of the substrate.

According to the first aspect of the invention, a ferromagnetic stack is provided on a part of an antiferromagnetic layer, width of an uppermost face of the ferromagnetic stack along a direction in which junction wall faces of a magnetoresistive element are opposed is smaller than width of an uppermost face of the antiferromagnetic layer in the same direction, and crystal c-axes in magnetic layers near the junction wall faces are in a direction along the ABS in a plane. Therefore, since the crystal c-axes in the magnetic layer near the junction wall face are oriented almost perpendicular to the junction wall face, an excellent effect such that the magnetic fluxes can be condensed to the magnetoresistive element is produced.

According to the second aspect of the invention, by optimizing the material, thickness, and sputter incident angle of an underlayer, the magnetic anisotropy of the magnetic layer can be increased. Therefore, the crystal c-axes in the magnetic layer near the junction wall face are oriented along the ABS, that is, in a direction almost perpendicular to the junction wall face. An excellent effect such that the magnetic fluxes can be condensed to the magnetoresistive element is produced.

BRIEF DESCRIPTION OF THE DRAWINGS

FIG. 6 is an outline drawing schematically showing a complete form of the magnetic sensor stack body according to the first embodiment;

DESCRIPTION OF THE PREFERRED EMBODIMENT

Embodiments of the present invention will be described below with reference to the drawings. The invention, however, is not limited to the embodiments.
<First Embodiment>
[Structure of Magnetic Sensor Stack Body]

Figure 1:
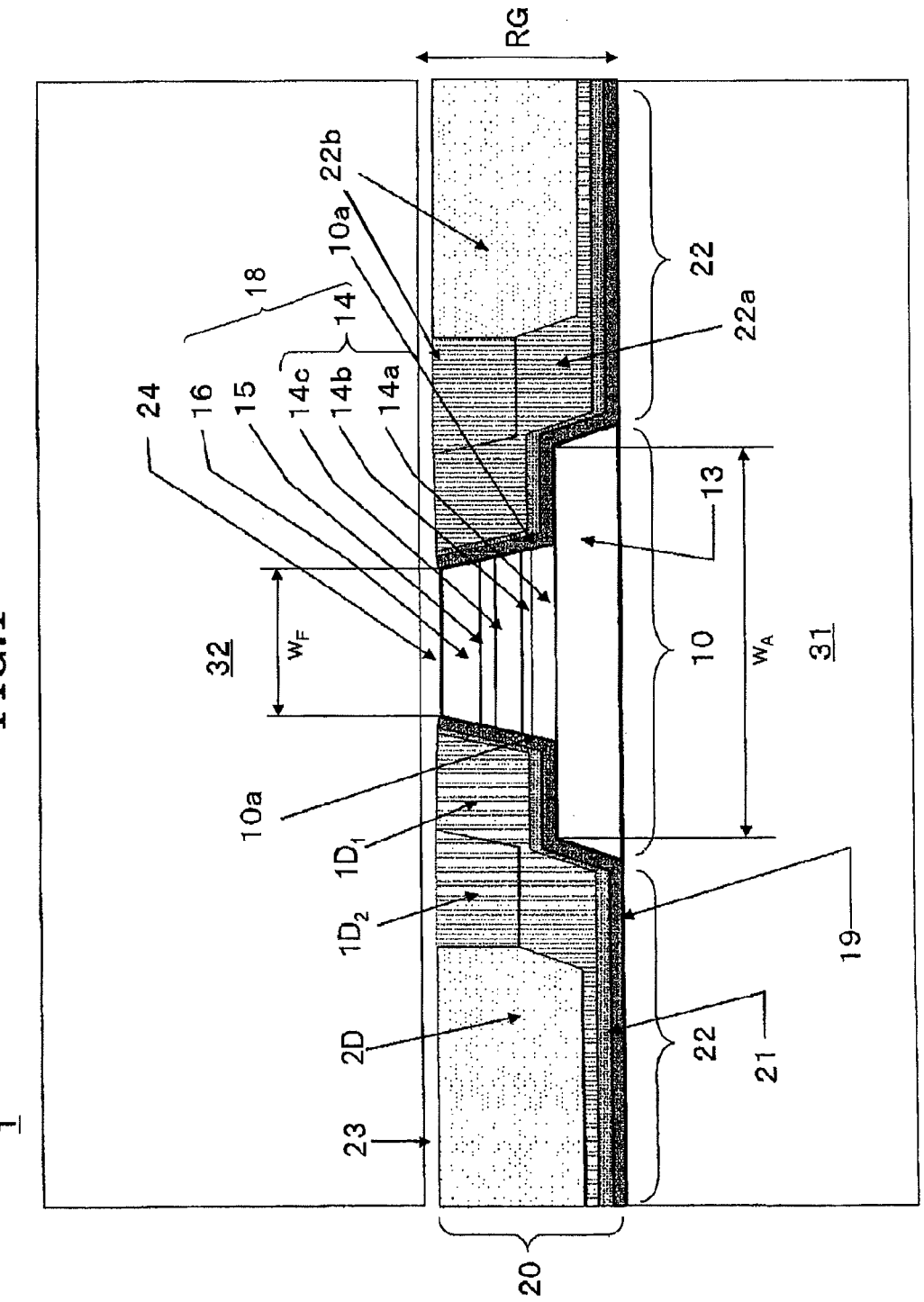
FIG. 1 is an outline drawing schematically showing a magnetic sensor stack body according to a first embodiment.
Figure 2:
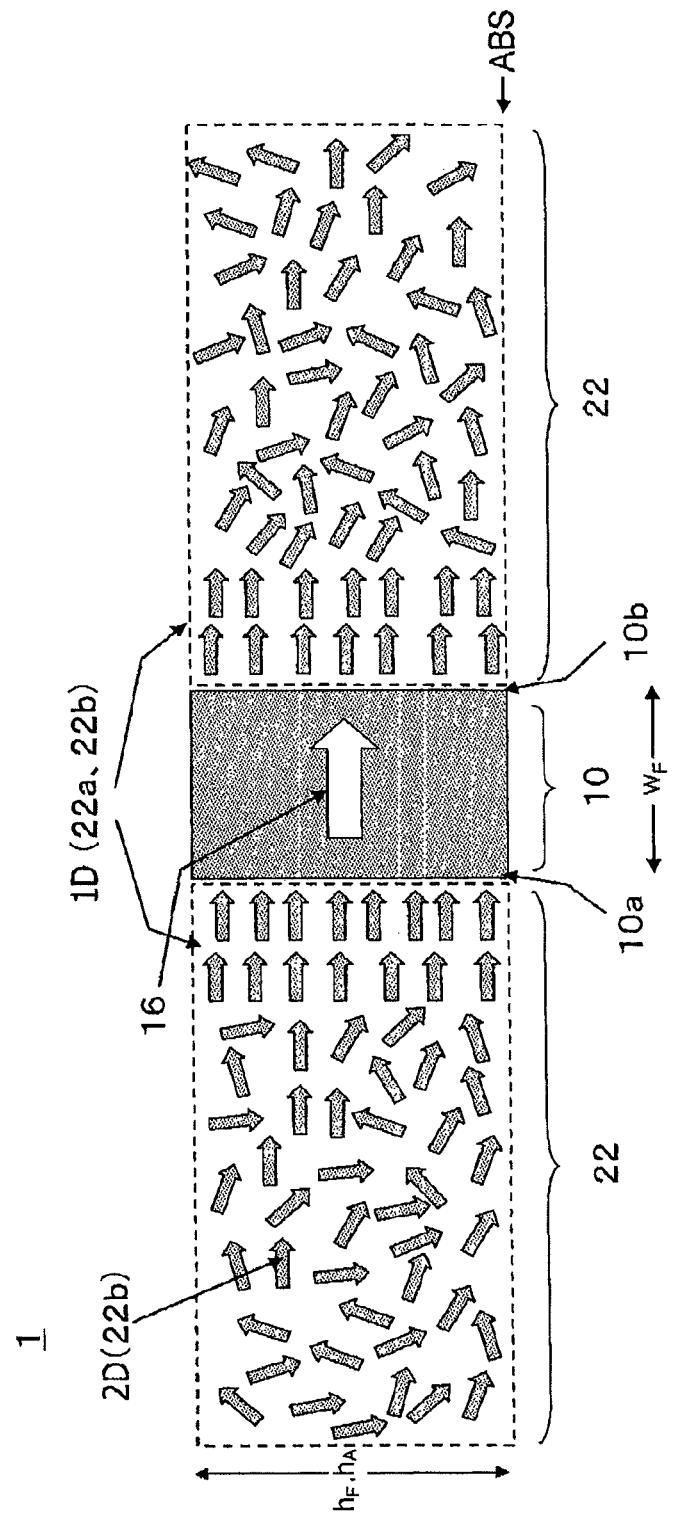
FIG. 2 is an outline drawing showing a profile perpendicular to a stack direction of the magnetic sensor stack body according to the first embodiment.

First, with reference to FIGS. 1 and 2, the structure of a magnetic sensor stack body having a magnetoresistive element will be described. FIG. 1 is an outline drawing schematically showing a magnetic sensor stack body according to the embodiment. FIG. 2 is an outline drawing showing a profile perpendicular to a stack direction of the magnetic sensor stack body according to the embodiment.

As shown in FIG. 1, a magnetic sensor stack body 1 according to the embodiment has, in an almost center on a substrate 31, a magnetoresistive element (reader stack) 10 made of a plurality of stack films having different compositions and having the magnetoresistive effect in which an electric resistance value fluctuates when a magnetic field is applied. The magnetic sensor stack body 1 also has, in field regions 22 on the sides of two opposed junction wall faces (surfaces) 10a and 10b of the reader stack 10, hard bias stack bodies 20 which can apply a bias magnetic field (a biasing field) to the reader stack 10. As described above, the magnetic sensor stack body has one or more reader stacks 10 and the hard bias stack bodies 20 on the substrate 31, and is an interim product before a sensor for a magnetic read head of a hard disk drive or the like is cut.

The reader stack 10 illustrated in FIG. 1 is a magnetic tunnel junction body (MTJ) having an oxide barrier layer (MgO) just below a free layer 16. The reader stack 10 is not limited to the above but may be a giant magnetoresistance junction body (GMR) most part of which being made of a metal having very low resistance.

Concretely, the reader stack 10 is, for example, stacked on a bottom shield layer (substrate) 31 made of a soft magnetic material such as NiFe and has, mainly, an antiferromagnetic pinning layer (AFM layer) 13 as an antiferromagnetic layer, a synthetic antiferromagnetic layer (SAF layer) 14, a spacer layer 15, and a ferromagnetic free layer 16.

The AFM layer 13 is made of, for example, an antiferromagnetic material such as IrMn. The AFM layer 13 is, for example, stacked over the bottom shield layer 31, as necessary, via a pre-seed layer made of Ta or the like and a third seed layer made of Ru or the like which are not shown.

The SAF layer 14 is made by two ferromagnetic layers 14a and 14c coupled in opposite directions via a thin coupling layer (a nonmagnetic layer or a tunnel insulating layer) 14b. The ferromagnetic layers of the SAF layer 14 are a pinned layer 14a which is in contact with the AFM layer 13 and a reference layer 14c which is in contact with the coupling layer 14b.

The spacer layer 15 is a nonmagnetic layer or a tunnel insulating layer and is, for example, an oxide layer made of MgO or the like.

The free layer 16 is made of, for example, a ferromagnetic material such as CoFeB and may be a layer obtained by stacking a Ta layer or a NiFe layer on a ferromagnetic layer made of CoFeB or the like. A bias magnetic field is applied to the free layer 16, and the free layer 16 is oriented so as to form a right angle with the reference layer 14c. With the layout, sensor sensitivity can be made high and linear response to an external magnetic field from a recording medium is provided. The bias magnetic field is also called "hard bias" and expected to be maintained constant throughout the life of a disk drive. The hard bias prevents a magnetic domain from being formed the free layer 16. A magnetic resistance change through the reader stack 10 is determined by relative directions of magnetizations of the reference layer 14c and the free layer 16.

As necessary, the free layer 16 is covered with a not-shown third capping layer (17 in FIG. 6) made of a material selected from, for example, Cr, Ru, Ta, Ti, alloys of them, C, and the like.

At least, a member obtained by bonding at least the pinned layer 14a, the spacer 15, and the free layer 16 is a ferromagnetic stack (FM stack) 18. In some cases, the FM stack 18 includes a not-shown third capping layer (17 in FIG. 6). The reader stack 10 of the embodiment has the FM stack 18 in a part on the AFM layer 13, and width $w_F$ of the uppermost face of the FM stack 18 along the direction in which the junction wall faces 10a and 10b are opposed to each other (the direction parallel to the drawing face) is set to be smaller than width $w_A$ of the uppermost face of the AFM layer 13 in the same direction. And, width of an lowermost face of the FM stack 18 along the direction in which the junction wall faces 10a and 10b are opposed to each other is set to be smaller than width $w_A$ of the uppermost face of the AFM layer 13 in the same direction. That is, the reader stack 10 is formed, for example, in a stepwise form such that the trapezoidal FM stack 18 narrower than the trapezoidal AFM layer 13 whose section is wide is stacked on the AFM layer 13. In the case of obtaining a magnetic read head sensor having a stripe height (depth in FIG. 1) "h" by cutting the magnetic sensor stack body 1 in a plane parallel to the drawing sheet, the width $w_F$ of the uppermost face of the FM stack 18 is preferably 20 nm to 30 nm since it corresponds to the head width. The width $w_A$ of the uppermost face of the AFM layer 13 is preferably equal to or less than 2.5 times, more preferably less than 2.5 times, as wide as the width $w_F$ of the uppermost face of the FM stack 18. When $w_A$ exceeds 2.5 times of $w_F$, the field region 22 decreases, and there is the possibility that the bias magnetic field cannot be sufficiently applied to the reader stack 10.

As described above, the hard bias stack body 20 is formed in the field region 22 on the substrate 31, and includes first and second magnetic layers 22a and 22b having magnetic part idles having a crystal c-axis. The first magnetic layer 22a is stacked so as to be in contact with the junction wall faces 10a and 10b of the reader stack 10, and the second magnetic layer 22b is stacked on the first magnetic layer 22a.

The first and second magnetic layers 22a and 22b made of, for example, an alloy (permanent magnet) having a hexagonal crystal structure (hcp) selected from Co—Pt, Co—Cr—Pt, and a group of alloys of Co—Pt and Co—Cr—Pt. The invention is not limited to the materials. The first magnetic layer 22a may be made of an alloy having a face-centered tetragonal structure (fct) selected from Fe—Pt, Co—Pt, and a group of alloys of Fe—Pt and Co—Pt.

Referring to FIGS. 1 and 2, the crystal c-axis direction (that is, crystal particle magnetization axis) of the first and second magnetic layers 22a and 22b will be described. 1113S in FIG. 2 denotes air bearing surface, $h_F$ and $h_A$ indicate stripe heights (depth in FIG. 1) of the FM stack 18 and the AFM layer 13, and $h_F=h_A$. The arrow on the free layer 16 of the reader stack 10 in FIG. 2 indicates a state where, for example, the free layer 16 is magnetized to right by application of the bias magnetic field of the hard bias stack 20.

Due to the existence of exchange coupling, neighboring magnetizations are directed more parallel to each other. In the magnetic sensor stack body 1 of the embodiment, in the field region 22 apart from the reader stack 10, the crystal c-axis directions (that is, crystal particle magnetization axes) in the second magnetic layer 22b are distributed at two-dimensional (2D) random in the film plane parallel to the substrate. On the other hand, in a step portion of the junction wall faces 10a and 10b of the reader stack 10, the crystal c-axes in not only the first magnetic layer 22a near the wall of the FM stack 18 but also the first magnetic layer 22a on the wall of the AFM layer 13 are oriented one-dimensionally ($1D_1$). The direction is parallel to the ABS in the film plane parallel to the substrate and is almost perpendicular to the junction wall faces 10a and 10b. Although the second magnetic layer 22b is stacked also on the first magnetic layer 22a on the AFM layer wall, the second magnetic layer 22b is epitaxially grown on the first magnetic layer 22a, so that the second magnetic layer 22b on the first magnetic layer 22a is also aligned one-dimensionally ($1D_2$).

An insulating layer 19 made of $Al_2O_3$ or the like is disposed in a lower part of the field region 22 and on the junction wall faces 10a and 10b of the reader stack 10. The insulating layer has a thickness of 2 to 5 nm in the junction wall face.

The first and second magnetic layers 22a and 22b are stacked on the bottom shield layer as the substrate 31 via the insulating layer 19 and, as necessary, an underlayer 21. The underlayer 21 is made of, for example, any of Cr, Cr—Mo, Cr—Ti, Nb, Ta, and W and an alloy having a body-centered cubic crystal structure (bcc) selected from an alloy group of them. The underlayer 21 has, for example, a thickness which is 3 to 8 nm in the field region and is less than 3 nm in the junction wall face.

In the underlayer 21, a double-layered underlayer may be constructed by adding a not-shown first seed layer on the underlayer 21. The junction wall faces 10a and 10b in the field region 22 and the reader stack 10 may further have a first seed layer selected from, for example, CrB, CrTiB, MgO, Ru, Ta, and Ti or an alloy selected from an alloy group of them. The first seed layer has, for example, a thickness which is less than 1 nm in the field region and is 0.5 to 2 nm in the junction wall face.

As necessary, the field region 22 and the junction wall faces 10a and 10b are covered with a first capping layer 23 made of, for example, a material selected from Cr, Ru, Ta, Ti, a group of alloys of Cr, Ru, Ta, and Ti, and C.

The magnetic sensor stack body 1 has the bottom shield layer 31 below the insulating layer 19 and has a top shield layer 32 on the first capping layer 23. The shield layers 31 and 32 are made of, for example, a soft magnetic material such as NiFe. That is, the reader stack 10 and the field region 22 are sandwiched between the two thick soft magnetic shield Layers 31 and 32. A gap between the shield layers 31 and 32 serves as a read gap (RG).

[Method of Forming Magnetic Sensor Stack Body]

Next, with reference to FIGS. 3 to 9, the operation of the magnetic sensor stack body 1 will be described and a method of forming the magnetic sensor stack body according to the embodiment will be also described.

Figure 3:
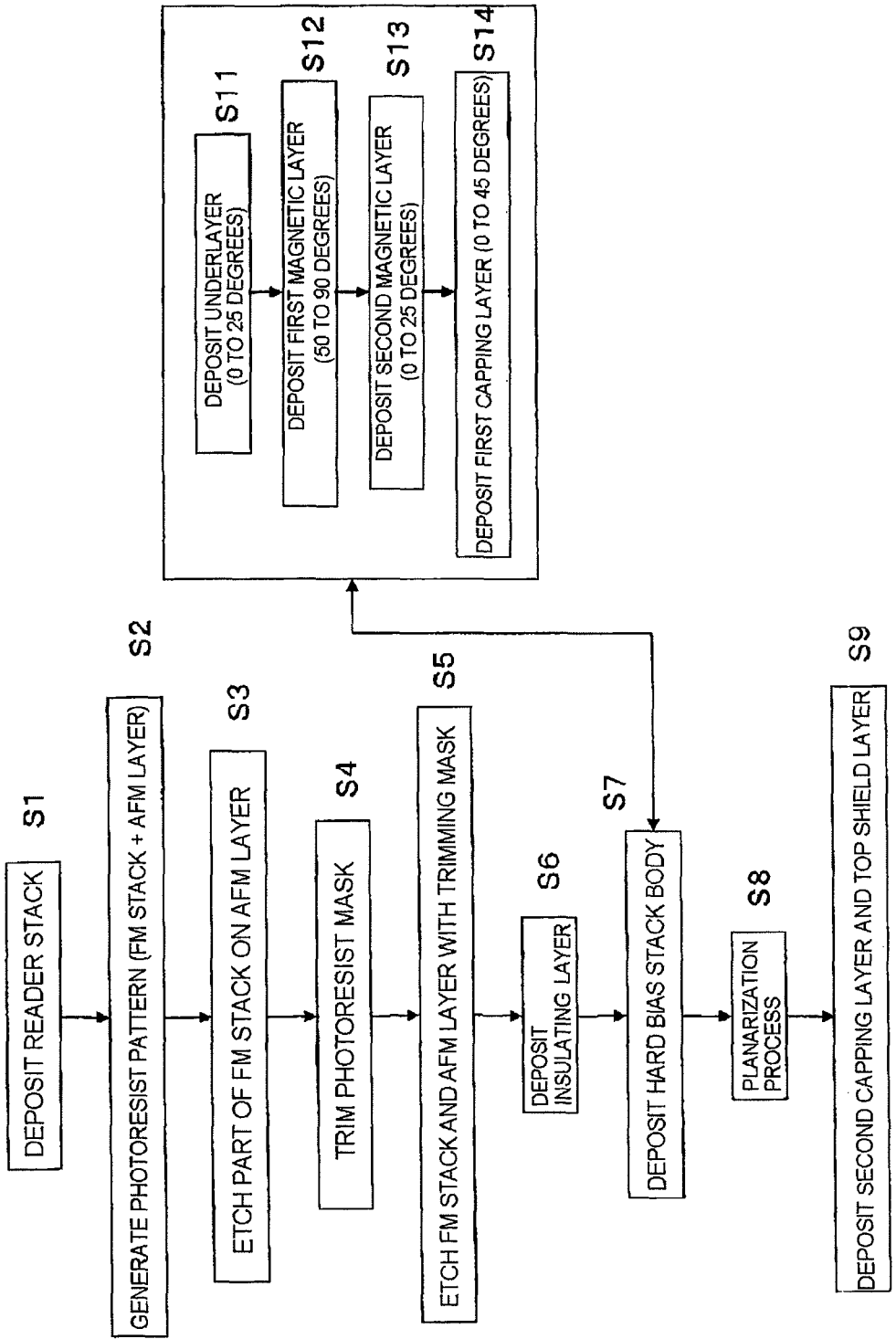
FIG. 3 is a process chart showing procedure of a method of forming the magnetic sensor stack body according to the first embodiment.

FIG. 3 is a process chart showing procedure of a method of forming the magnetic sensor stack body according to the first embodiment. A method of forming the magnetic sensor stack body 1 according to the embodiment has, as shown in FIG. 3, the step of forming, on the substrate 31, the reader stack 10 having at least the AFM layer 13 and the FM stack 18 (step 1 which will be described as "Si" below). The method also includes: a step (S2) of forming a pattern of a photoresist mask (PR) 41 on the reader stack 10; and a step (S3) of etching a part of the FM stack 18 having a thickness almost equal to that of the AFM layer 13. The method further includes: a step (S9) of trimming width of the photoresist mask 41; and a step (S5) of etching the FM stack 18 and the AFM layer 13 by using a trimmed photoresist mask 41a. The method includes: a step (S6) of forming the insulating layer 19; a step (S7) of stacking the hard bias stack body 20 in the field region 22; a step (S8) of planarizing the surface, and a step (S9) of forming the second cap layer 24 and the top shield layer 32.

Further, the step (S7) of stacking the hard bias stack body 20 in the field region 22 has a first step (S11) of forming the underlayer 21 at a film forming angle $\theta_1$ ($\theta_1$=0 to 25 degrees) from a normal of the substrate 31. The step has a second step (S12) of forming the first magnetic layer 22a at a film forming angle $\theta_2$ ($\theta_2$=50 to 90 degrees) from a normal of the substrate 31. The step has a third step (S13) of forming the second magnetic layer 22b at a film forming angle $\theta_3$ ($\theta_3$=0 to 25 degrees) from a normal of the substrate 31. The method has a fourth step of forming the first capping layer 23 at a film forming angle $\theta_4$ ($\theta_4$=0 to 45 degrees) from a normal of the substrate.

Referring to FIGS. 4A to 4D and FIGS. 5A to 5D, the method of forming the magnetic sensor stack body 1 according to the embodiment will be concretely descried. FIGS. 4A to 4D and FIGS. 5A to 5D are explanatory diagrams showing a concrete method of forming the magnetic sensor stack body 1.

Figure 4A:
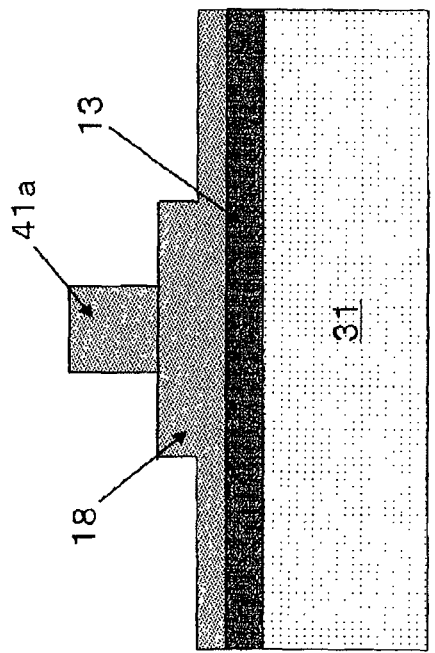
FIGS. 4A to 4D are explanatory diagrams showing a concrete method of forming the magnetic sensor stack body.

First, as shown in FIG. 4A, the magnetic sensor stack body 1 is formed by forming the AFM layer 13 and the FM stack 18 as the reader stack 10 on the substrate 31. As the substrate 31, for example, a bottom shield layer made of a soft magnetic material such as NiFe is employed. As described above, the AFM layer 13 is formed by, for example, an antiferromagnetic material such as IrMn and, as necessary, is stacked via a pre-seed layer made of Ta or the like and a third seed layer made of Ru or the like. The FM stack 18 is formed by at east, the SAF layer 14, the spacer layer 15, and the free layer 16 (refer to FIG. 1) and, as necessary, covered with a not-shown third capping layer (17 in FIG. 6) made of a material selected from Cr, Ru, Ta, and Ti, a group of alloys of them, and C.

Next, the photoresist (PR) mask 41 is applied on the FM stack 18 and patterned, and developed. The photoresist mask 41 is used to mask a part of the FM stack 18 in an etching process which will be described later. The width $W_A$ of the AFM layer 13 in the reader stack 10 having a stepwise form which will be described later is determined mainly by the width of the photoresist mask 41.

Figure 4C:
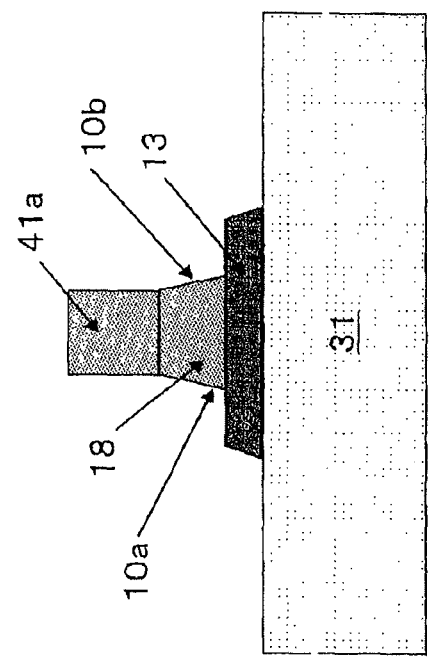
Figure 4B:
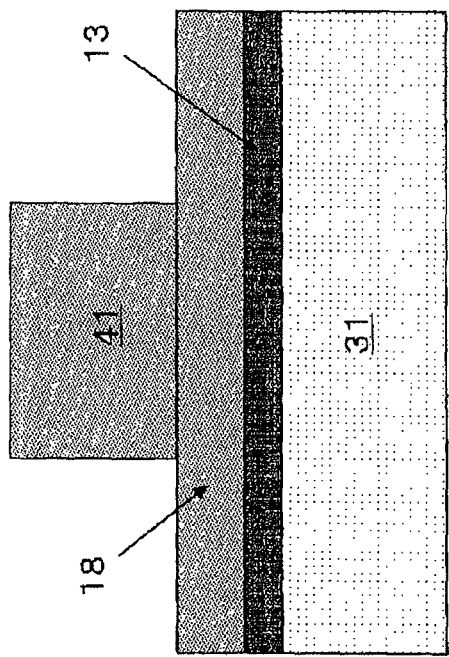

As shown in FIG. 4B, the surface side of the FM stack 18 other than the portion covered with the photoresist mask 41 is etched, and the etching is stopped at thickness almost equal to the thickness of the AFM layer 13. For the etching process, for example, ion beam etching (IBE), reactive ion etching (RIE), or the like is employed. However, with the IBE, an (itched material is re-deposited on the wall of the photoresist mask 41, and it becomes difficult to trim the photoresist mask 41. Consequently, it is preferable to perform etching by oxygen-free RIE.

After that, as shown in FIG. 4C, for example, by using plasma oxygen process or the like, the photoresist mask 41 in the width direction on the FM stack 18 is trimmed to a width that determines the width $W_A$ of the FM stack. The trimmed photoresist mask 91a is used as a mask for etching the AFM layer 13 and the FM stack 18.

Figure 4D:
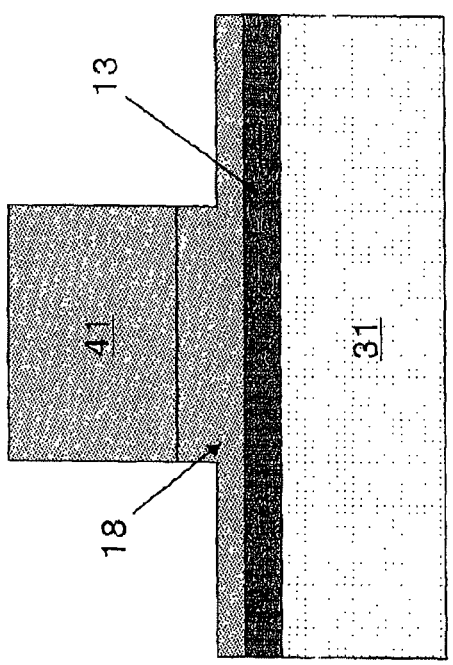

Next, as illustrated in FIG. 4D, the FM stack 18 and the AFM layer 13 in the portion other than the portion covered with the trimming mask 41a are etched and removed. For the etching process, in a manner similar to the above, for example, ion beam etching (IBE), reactive ion etching (RIE), or the like is employed. The etching is stopped by the bottom shield face, thereby forming the stepwise reader stack 10 having the FM stack 18 on a part of the AFM layer 13, in which the width $w_F$ of the uppermost face of the FM stack 18 along the direction in which the junction wall faces 10a and 10b are opposed to each other is smaller than the width $w_A$ of the uppermost face of the AFM layer 13 in the same direction.

Figure 5A:
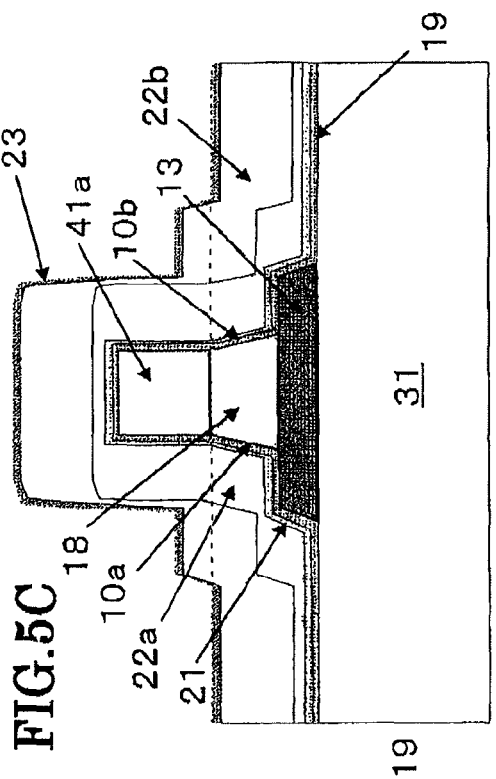
FIGS. 5A to 5D are explanatory diagrams showing a concrete method of forming the magnetic sensor stack body.

After the etching process, as shown in FIG. 5A, the insulating layer 19 is coated on the substrate 31 on which the stepwise reader stack 10 is formed (the reader stack 10 including the trimming mask 41a and the sides of the junction wall faces 10a and 10b). The insulating layer 19 is formed to regulate passage of current to the sensor and is preferably made of, for example, an oxide such as alumina ($Al_2O_3$) or silica ($SiO_2$) or a nitride such as $Si_3N_4$. To form the insulating layer 19, for example, any of the physical vapor deposition, ion beam deposition (IBD), atomic layer deposition (ALD), and chemical vapor deposition (CVD) is used. The ALD and CVD have an advantage that conformal film formation is possible.

Next, the hard bias stack body 20 is formed on the insulting layer 19. In the case of the basic hard bias stack body 20, first, the underlayer 21 is formed on the insulating layer 19, and the magnetic layers 22a and 22b and the first capping layer 23 are formed. For the underlayer 21, for example, Cr or W, an alloy of Cr or W, or the like is preferable. Preferably, the underlayer 21 is formed by, for example, IBD, ionized PDV, collimated PVD, or the like at an angle almost perpendicular to the face of the substrate 31 (the angle from the normal of the substrate, that is, film forming angle $\theta_1=0$ to 25 degrees). The major part of the underlayer 21 is deposited on the field region 22 and the horizontal face of the stepwise reader stack.

Figure 5C:
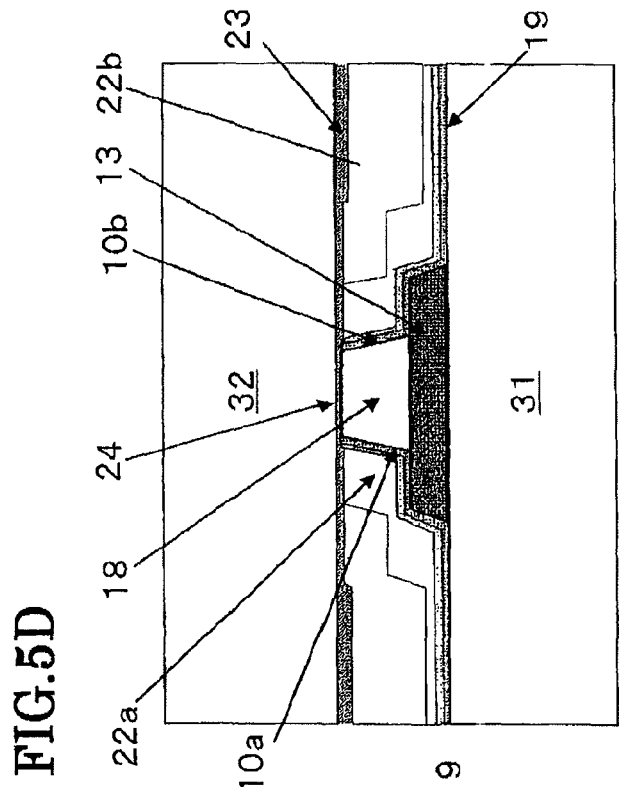
Figure 5B:
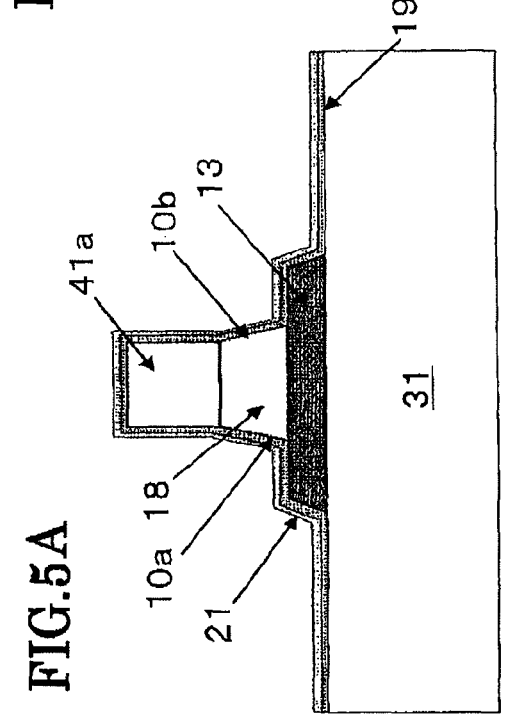

As shown in FIG. 5B, the first magnetic layer 22a is formed by oblique deposition (the angle from the normal of the substrate 31, that is, film forming angle $\theta_2$ is 50 to 90 degrees, preferably 50 to 80 degrees). A major part of the first magnetic layer 22a is formed on the junction wall faces 10a and 10b and the field region 22 near the junction wall faces 10a and 10b in a state where the crystal c-axes are aligned almost perpendicular to the junction wall faces 10a and 10b.

Further, as shown in FIG. 5C, the second magnetic layer 22b is formed on the first magnetic layer 22a. The second magnetic layer 22b is formed by, for example, using IBD, ionized PVD, collimated PVD, or the like at an angle almost perpendicular to the surface of the substrate 31 (the angle from the normal of the substrate 31, that is, the film forming angle $\theta_3=0$ to 25 degrees). After that, to protect the first and second magnetic layers 22a and 22b, the first capping layer 23 is formed as an etching stop layer or a chemical mechanical polishing (CMP) stopping layer on the second magnetic layer 22b at an angle almost perpendicular to the surface of the substrate 31 (the angle from the normal of the substrate 31, that is, the film forming angle $\theta_4=0$ to 45 degrees).

Figure 5D:
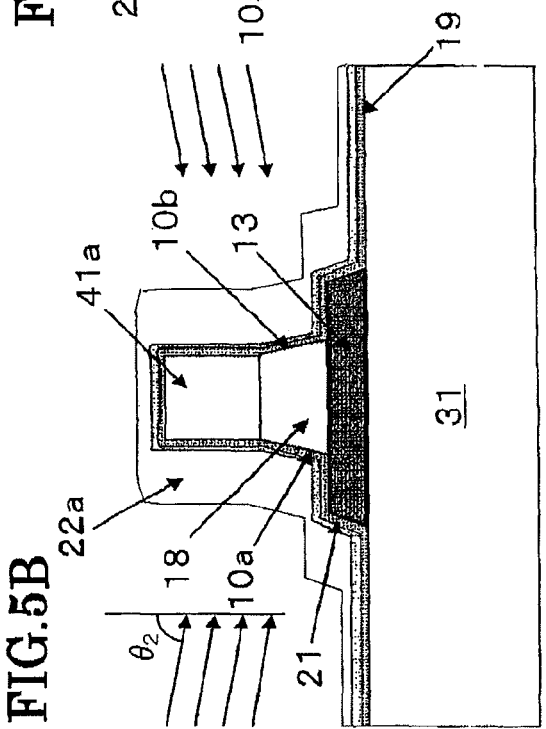

As shown in FIG. 5D, after forming the first capping layer, the surface is planarized at a level shown by a broken line in FIG. 5C by CMP, acute-angle ion beam etching (IBE), or the like. After forming a second capping layer 24, the top shield 32 is formed.

FIG. 6 is an outline drawing schematically showing a complete form of the magnetic sensor stack body 1 according to the first embodiment. As described above, the reader stack 10 of the magnetic sensor stack body 1 is formed in a stepwise form, the first step is formed by the AFM layer 13, and the second step is formed by the FM stack 18 narrower than the AFM layer 13. Portions in contact with the junction wall faces 10a and 10b in the stepwise form of the hard bias stack member 20 have a corresponding stepwise shape. In the stepwise portions in the hard bias stack member 20, the crystal c-axes in not only the first magnetic layer 22a near the wall of the FM stack 18 but also the first magnetic layer 22b on the wall of the AFM layer 13 are aligned one-dimensionally ($1D_1$) almost perpendicular to the junction wall faces 10a and 10b. Further, since the second magnetic layer 22b is epitaxially grown on the first magnetic layer 22a on the wall of the AFM layer, the crystal c-axes in the second magnetic layer 22b on the one-dimensional ($1D_1$) first magnetic layer 22a are also aligned one-dimensionally ($1D_2$). The magnetic layers aligned in one-dimensionally ($1D_1$ and $1D_2$) have the function of converging the magnetic flux from the second magnetic layer 22b apart from the reader stack 10 to the free layer. Therefore, since the c axes of the one-dimensional ($1D_1$ and $1D_2$) magnetic layers are oriented near the reader stack 10 in the field region 22, the bias efficiency does not depend on the crystal particle diameter. Further, local magnetic fields in the junction wall faces at an end of the free layer 16 tend to become more uniform even in the case where the stripe height (depth) is decreased. That is, by using the oblique film formation of the stepwise-form reader stack 10 and the first magnetic layer 22a, a one-dimensional region can be expanded.

Figure 17:
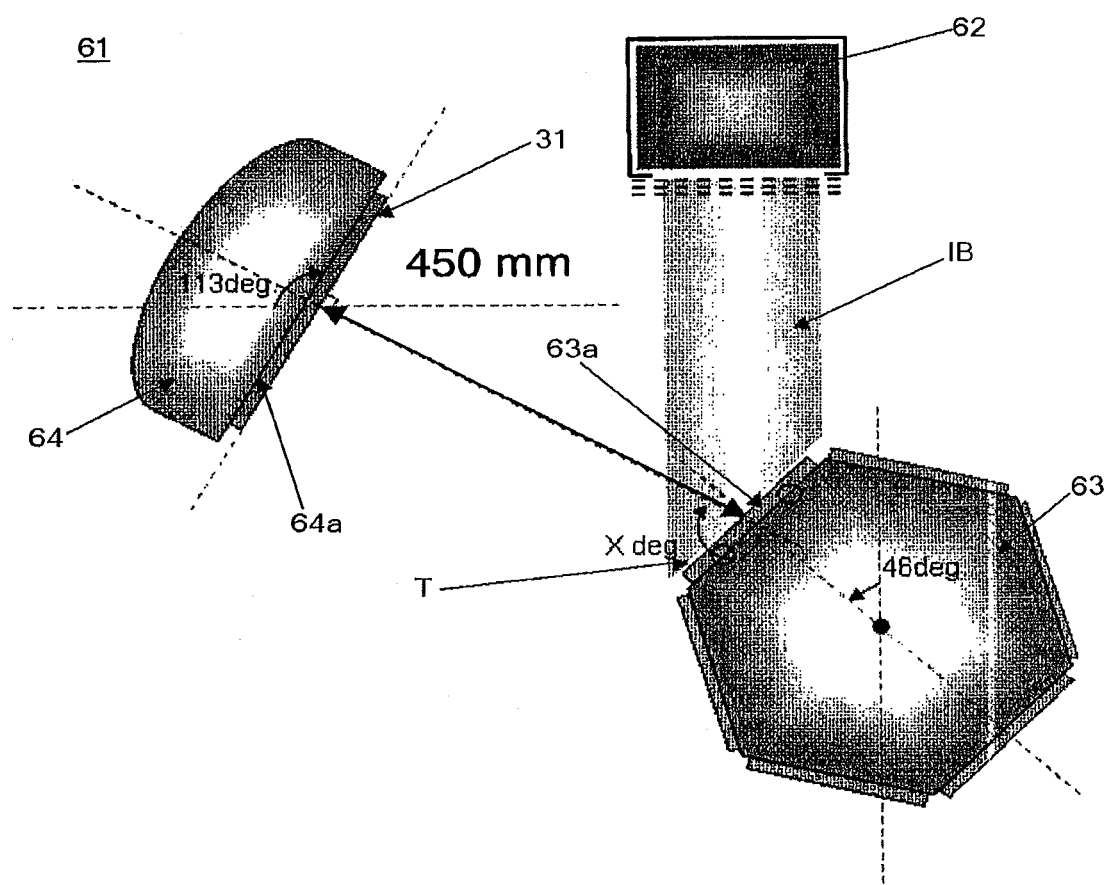
FIG. 17 is an outline drawing showing an example of an ion beam deposition system.
Figure 18:
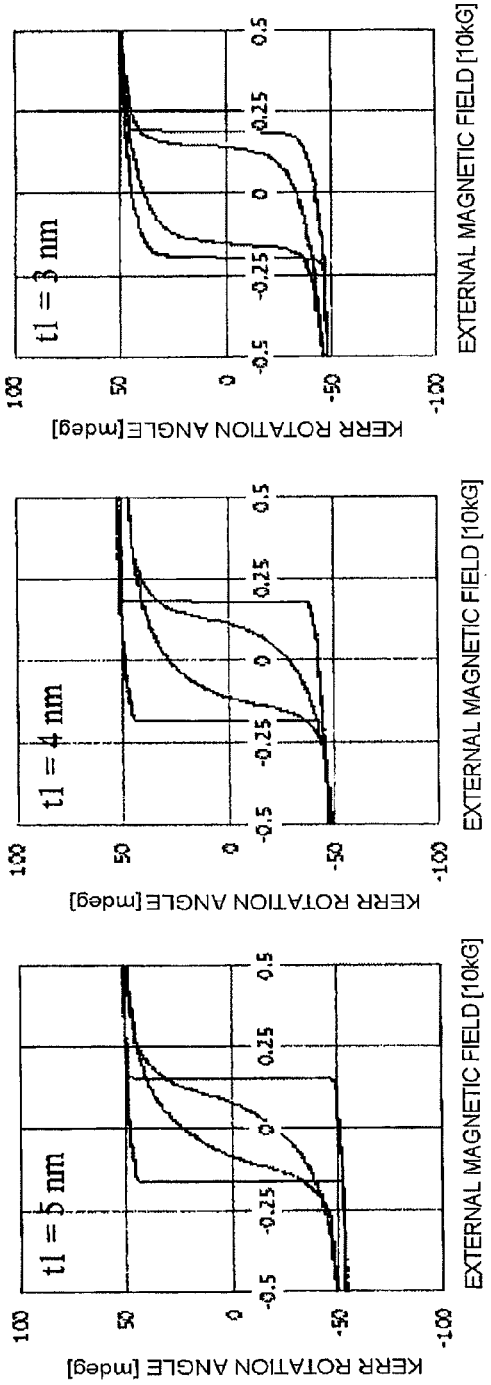
FIGS. 18A to 18E are outline drawings showing a layer configuration of the hard bias stack body and a magnetization loop of the hard bias stack body.

The orientation of magnetism is achieved by IBD, PVD, or the like as shown in FIG. 17. In the case of a large substrate (wafer of 5 to 8 inches), however, the incidence angle of a formed film is an acute angle with respect to the face of the substrate 31, an inboard-outboard difference (the difference in film thickness on a substrate center direction side and a substrate outer periphery side with respect to the reader stack) occurs at an initial stage of forming a CoPt film.

Figure 7:
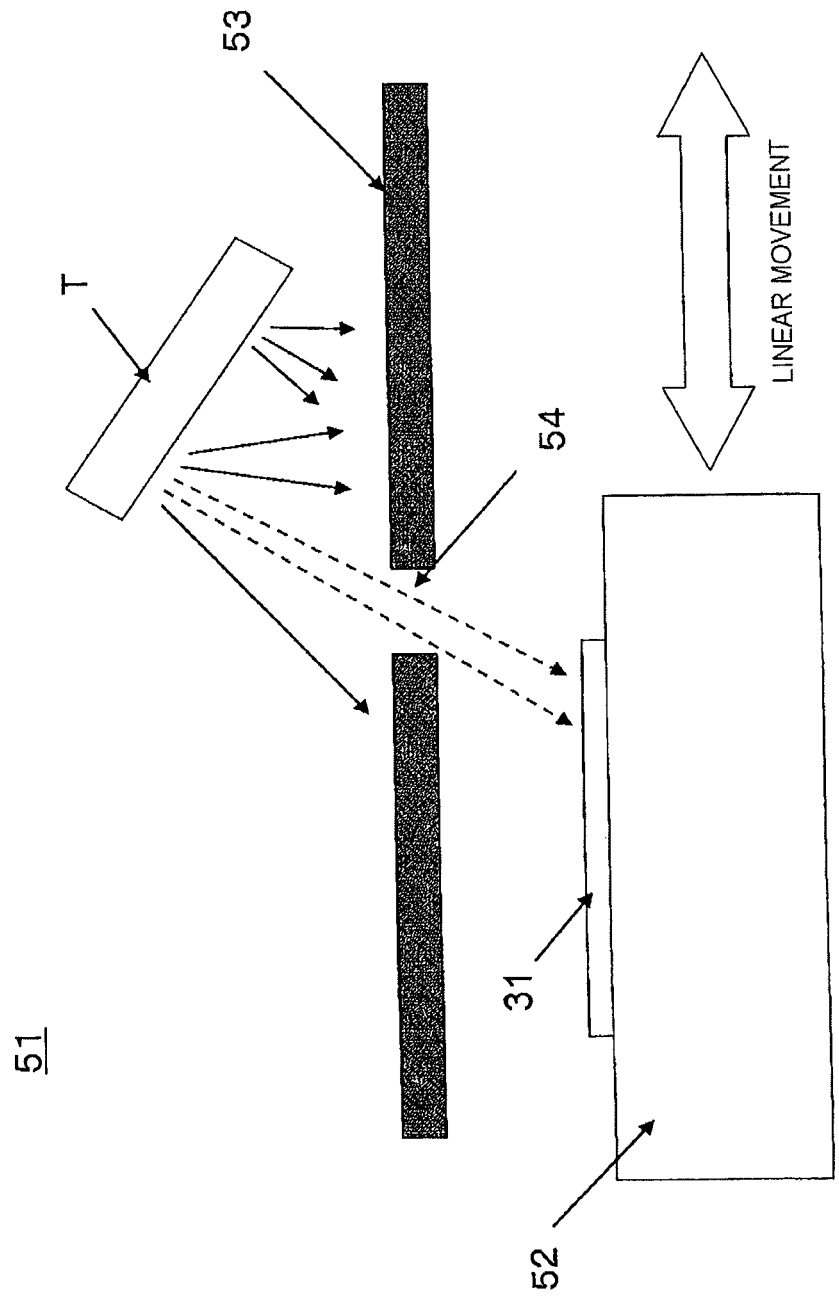
FIG. 7 is an outline drawing schematically showing a film forming apparatus used for film forming methods in the first to third embodiments.
Figure 8:
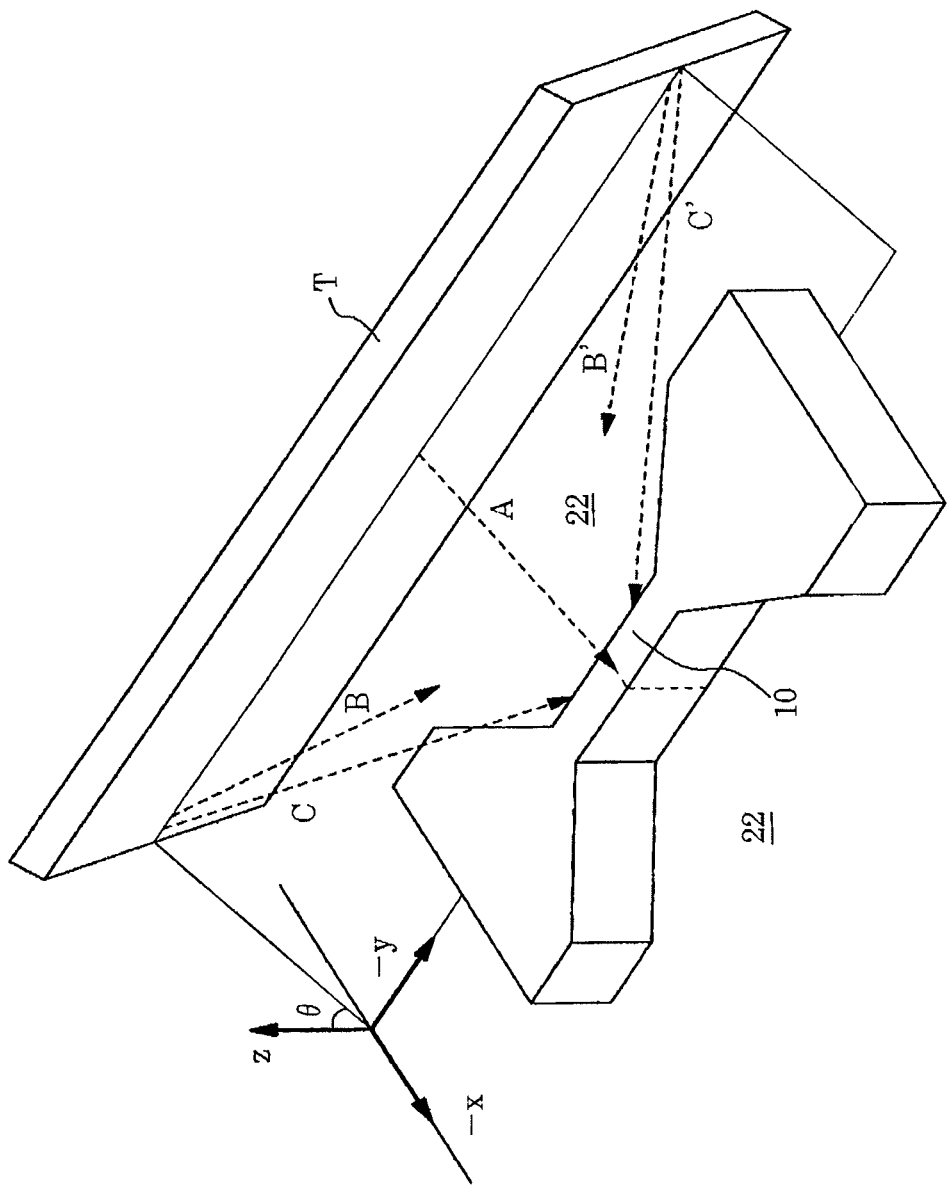
FIG. 8 is a perspective view schematically showing the film forming apparatus used for the film forming methods in the first to third embodiments.

To address it, in the film forming method of the embodiment, a film forming apparatus as shown in FIGS. 7 and 8 is used. FIG. 7 is an outline drawing schematically showing a film forming apparatus used for the film forming method in the embodiment. FIG. 8 is a perspective view schematically showing the film forming apparatus used for the film forming method in the embodiment.

As shown in FIGS. 7 and 8, the film forming apparatus 51 is, for example, an apparatus for forming a film on the substrate 31 held on a substrate holder 52 by IBD or the like, and a slit shutter 53 is disposed in front of a target T obliquely held. The substrate holder 52 has not-shown linear moving means and can linearly move so as to be orthogonal to a slit 54 in the shutter 53. The film forming apparatus 51 has a not-shown elongated rectangular cathode magnet which is parallel to the junction wall faces of the reader stack 10.

By using such a film forming apparatus 51, the substrate 31 is moved or scanned with predetermined speed under the longitudinal target T forming a right angle with respect to the drawing sheet of FIG. 7. As shown in FIG. 8, the junction wall faces of the reader stack 10 are disposed in parallel to the longitudinal target T. That is, the junction wall faces 10a and 10b of the reader stack 10 are along the y-axis direction in FIG. 8, and are sputter irradiated along the x-axis direction from the target T as shown by, for example, broken lines A, B, B', C, and C'.

As shown in FIG. 4D, two field regions 22 are provided for forming the hard bias stack body 20 on both sides of the junction wall faces 10a and 10b of the stepwise reader stack 10. A number of such patterns are formed in parallel on the substrate 31. That is, a plurality of reader stacks 10 are disposed on the substrate, and the hard bias stack bodies are stacked in the field regions 22 on both sides of each of the reader stacks 10 in the same process.

The underlayer 21 is formed by incidence almost perpendicular to the face of the substrate 31. Most of films are formed over the field region 22, and layers on the reader stack 10 and the photoresist mask 41a are very thin. The first magnetic layer 22a is formed by two steps.

In the first step, while moving the substrate 31 at predetermined speed under the target T until a film is formed from end to end, a film is formed on the junction wall face 10a (or 10b) as one of the junction wall faces of the reader stack 10 at an acute angle to the surface of the substrate 31. In the following second step, the substrate 31 is turned by 180 degrees and moved below sputter magnetic fluxes so that a film can be formed at the same angle on the other junction wall face 10b (or 10a). Although the minimum number of passage times is two, as long as the final thickness (15 to 40 nm) on both sides is the same, the number of passage (reciprocation) times may be increased.

The second magnetic layer 22b can be formed at an angle almost perpendicular to the face of the substrate 31 by the same method as that for the first magnetic layer 22a except for the incident angle. The first capping layer (for example, Ta) is formed in a manner similar to the second magnetic layer 22b. Ta is deposited on the field region 22 more than on the junction wall faces 10a and 10b or the photoresist mask walls.

The underlayer 21, the second magnetic layer 22b, and the first capping layer 23 can be formed by existing IBD or ionized PVD using an RF sputter of a frequency of 60 MHz. However, the first magnetic layer 22a is formed by a method using the rectangular target T by using the film forming apparatus 51 in FIG. 7. There is shadowing but film is formed on both field regions.

In the embodiment, as the first magnetic layer 22a, an alloy Co—Pt which is most generally used is employed. Although another material such as Fe—Pt may be grown by using a face-centered tetragonal structure on the junction wall face, it is considered that a temperature of 200° C. or higher is necessary. In this case, when a hard mask and RIE (Reactive Ion Etching) are used for formation of the sensor stack body, there is no photoresist mask 41a at the time of forming the hard bias stack body, and it is suitable.

A Co—Pt (0001) lattice plane can be grown on an MgO (001) lattice plane or a Cr (002) lattice plane. That is, c-axes can be created in a direction almost perpendicular to the junction wall face (directions of magnetic anisotropy).

The above is based on assumption that all of reader stacks 10 on the substrate 31 are patterned so as to be parallel to each other. The junction wall faces of the reader stack 10 are held in parallel to the rectangular target T as shown in FIG. 8 during film formation.

Specifically, formation of the first magnetic layer 22a has a step of forming one of junction wall faces 10a and 10b of the reader stack 10 by linearly moving the substrate 31 at predetermined speed under the target T. The method also has a step of turning the substrate 31 by 180 degrees around its center perpendicular axis as a center, and forming the first magnetic layer on the other face of the junction wall faces 10a and 10b by linearly moving the substrate 31 at predetermined speed under the target T.

On the other hand, as described above, formation of the underlayer 21, the second magnetic layer 22b, and the first capping layer 23 is different from that of the first magnetic layer 22a with respect to the film formation angle (the incident angle of sputter particles or the like). However, also in the case of the underlayer 21, the second magnetic layer 22b, and the first capping layer 23, the method has a step of forming a film on one of the field regions 22 by linearly moving the substrate 31 at predetermined speed under the target T. The method has a step of turning the substrate 31 by 180 degrees around its center perpendicular axis as a center, and forming a film on the other field region 22 by linearly moving the substrate 31 at predetermined speed under the target T.

An algorithm of the film forming method in the steps and the steps of forming films in the field regions is installed as a film formation control program on, for example, a recording device such as an HDD or ROM provided for a not-shown control system in an IBD system and properly read and executed by a CPU.

The film formation control programs are follows.

1. The film formation control program for a magnetic sensor stack body, for disposing, on a substrate, a stepwise-shaped magnetoresistive element having at least a ferromagnetic stack on a part of an antiferromagnetic layer and, in field regions on sides of opposed two junction wall faces of the magnetoresistive element, forming a hard bias stack body for applying a bias magnetic field to the element, the program making an apparatus for forming the magnetic sensor stack body execute:

a step of forming the antiferromagnetic layer and the ferromagnetic stack on the substrate;

a step of forming a pattern of a photoresist mask on the ferromagnetic stack;

a step of etching a part of the ferromagnetic stack;

a step of trimming the photoresist mask in a width direction;

a step of forming the stepwise-shaped magnetoresistive element by etching the ferromagnetic stack and the antiferromagnetic layer using the trimmed photoresist mask;

a step of forming a hard bias stack body in the field region; and a step of planarizing the surface of the stepwise-shape magnetoresistive element and the hard bias stack body.

2. The film formation control program for a magnetic sensor stack body according to the above program 1, wherein in the stepwise-shaped magnetoresistive element, width of an uppermost face of the ferromagnetic stack along a direction in which the junction wall faces are opposed to each other is set to be smaller than width of an uppermost face of the antiferromagnetic layer along the direction in which the junction wall faces are opposed to each other.

3. The film formation control program for a magnetic sensor stack body according to the above program 1, wherein the step of forming the hard bias stack body comprises:

a step of forming an underlayer at a film forming angle $\theta_1$ ($\theta_1$=0 to 25 degrees) from the normal of the substrate;

a step of forming a first magnetic layer at a film forming angle $\theta_2$ ($\theta_2$=50 to 90 degrees) from the normal of the substrate;

a step of forming a second magnetic layer at a film forming angle $\theta_3$ ($\theta_3$=0 to 25 degrees) from the normal of the substrate; and a step of forming a first capping layer at a film forming angle $\theta_4$ ($\theta_4$=0 to 45 degrees) from the normal of the substrate.

4. The film formation control program for a magnetic sensor stack body according to the above program 1, further comprising a step of forming an insulating layer before the step of forming the hard bias stack body in the field region.

5. The film formation control program for a magnetic sensor stack body according to the above program 1, further comprising a step of forming a second capping layer after the step of planarizing the surface of the magnetoresistive element and the hard bias stack body.

6. The film formation control program for a magnetic sensor stack body according to the above program 5, further comprising a step of forming a shield layer after the step of forming the second capping layer.

7. The film formation control program for a magnetic sensor stack body according to the above program 1, wherein the first magnetic layer is formed on one of junction wall faces of the magnetoresistive element while linearly moving the substrate at predetermined speed under an elongated target parallel to the junction wall faces of the magnetoresistive element, the substrate is turned by 180 degrees around its center perpendicular axis as a center, and the first magnetic layer is formed on the other face of the junction wall faces while linearly moving the substrate at predetermined speed under the target.

8. The film formation control program for a magnetic sensor stack body according to the above program 7, wherein the underlayer, the second magnetic layer, and the first capping layer are formed on one of field regions while linearly moving the substrate at predetermined speed under the target, the substrate is turned by 180 degrees around its center perpendicular axis as a center, and the layers are formed on the other field region while linearly moving the substrate at predetermined speed under the target.

A recording medium is a computer-readable portable recording medium. The film formation control program recorded on the recording medium is installed on the storage device. Examples of the recording medium include flash memories such as compact flash (registered trademark), SmartMedia (registered trademark), memory stick (registered trademark), multimedia card, and SD memory card, removable hard disks such as micro drive (registered trademark), magnetic recording media such as floppy disk (registered trademark), magnetooptic recording media such as MO, and optical disks such as CD-R, DVD-R, DVD+R, DVD-RAM, DVD+RW (registered trademark), and PD.

Next, the operation and effect of the first embodiment of the invention will be examined in comparison with an example in which the AFM layer 13 in the magnetoresistive element 10 in the magnetic sensor stack body 1 is partitioned into predetermined ranges and the first embodiment of the invention is not applied.

Figure 9A:
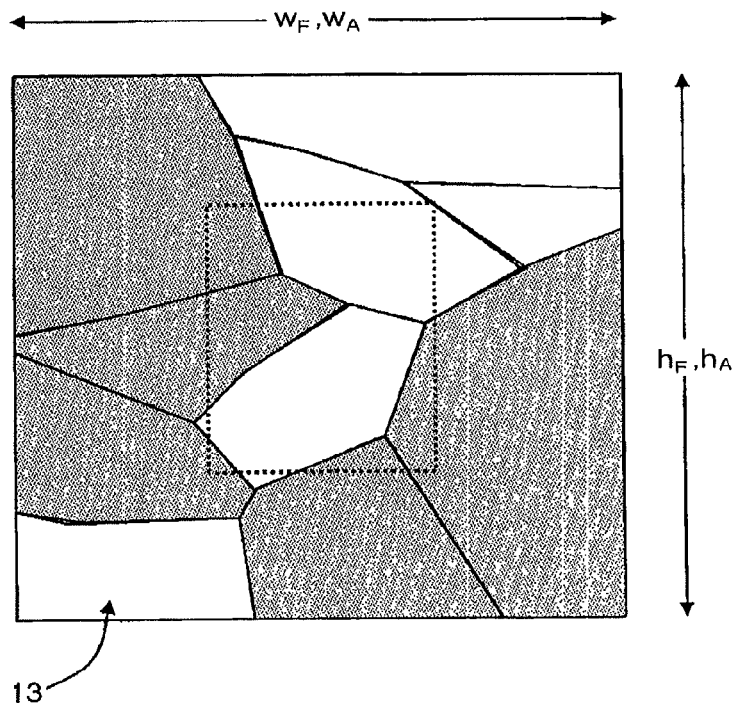
FIG. 9A is an outline drawing of an AFM layer and its crystal grains, in a magnetoresistive element formed as a comparative example.

FIG. 9A is an outline drawing of the AFM layer and its crystal grains, in a magnetoresistive element formed as a comparative example. In the magnetoresistive element shown in FIG. 9A, width $w_F$ of the FM stack=width $w_A$ of the AFM layer=80 nm, and stripe height $h_F$ of the FM stack=stripe height $h_A$ of the AFM layer=80 nm. As shown in FIG. 9A, in a range of 80 nm×80 nm, the AFM layer 13 is made of ten crystal grains. Most of the crystal grains are stable due to their dimensions or exchange coupling. When the dimension of the magnetoresistive element decreases to 30 nm (widths $w_F$, $w_A$)×40 nm (stripe heights $h_F$, $h_A$) shown by a dotted line, the number of crystal grains in the AFM layer 13 below the FM stack decreases to seven. Five crystal grains (hatched crystal grains) out of seven crystal grains are thermally unstable because their dimensions become small.

Figure 9B:
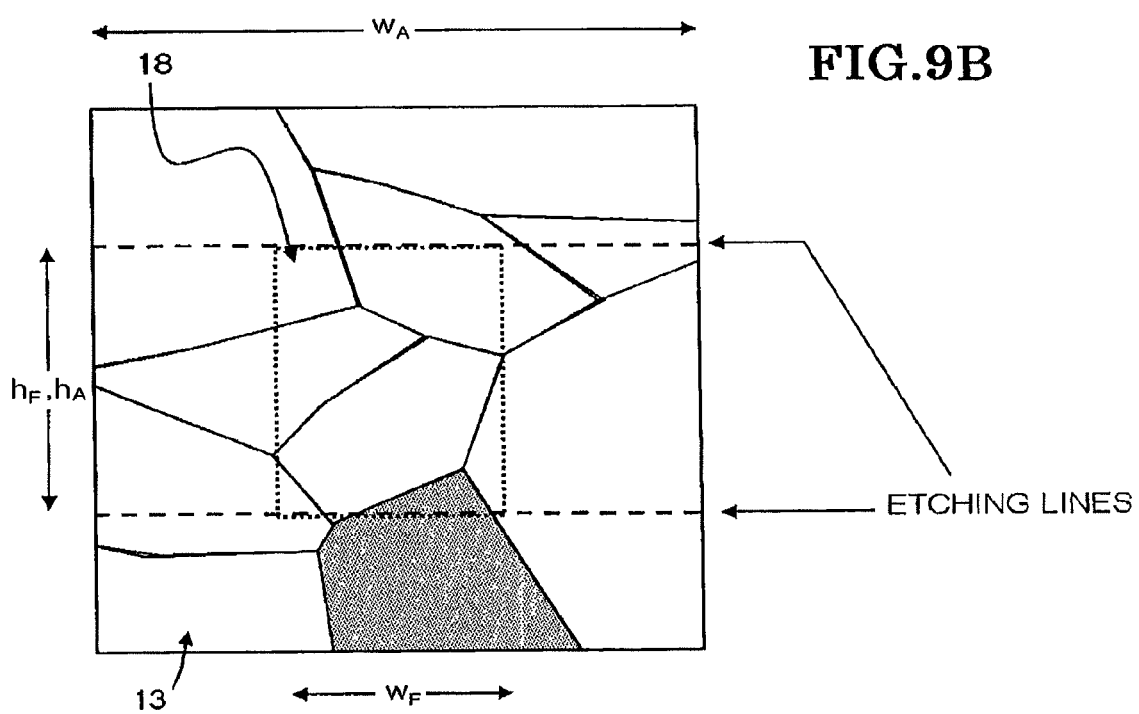
FIG. 9B is an outline drawing of an AFM layer and its crystal grains, in a magnetoresistive element of the embodiment.

FIG. 9B is an outline drawing of the AFM layer and its crystal grains, in the magnetoresistive element of the embodiment. As shown in FIG. 9B, the FM stack 18 decreases to the same dimensions (30 nm (width $w_F$)×40 nm (stripe height $h_F$) as those of FIG. 9A but the AFM layer 13 extends in the width direction of the magnetoresistive element, that is, the dimensions of the AFM layer 13 are 80 nm (width $w_F$)×40 nm (stripe height $h_F$). Only one crystal grain (hatched crystal grain) in a lower part of the FM stack 18 is potentially unstable. Therefore, by expanding the width $w_A$ of the AFM layer 13, thermal stability markedly improves.

As described above, in the magnetic sensor stack body 1 and the method of forming the same of the embodiment, the stepwise reader stack 10 in which the width $w_F$ of the FM stack 18 having a multilayer structure is smaller than the width $w_A$ of the AFM layer 13 is provided. Therefore, to prevent instability thermally induced by increase in TPI and decrease in the width $w_F$ of the FM stack 18, the width $w_A$ of the AFM layer 13 is maintained or designed wider. However, because of the stepwise AFM layer 13 and the FM stack 18, the first magnetic layer 22a extending from the places near the junction wall faces 10a and 10b to the field region 22 becomes thinner according to the difference between the width of the AFM layer 13 and the width of the FM stack 18 having the multilayer structure.

There is an excellent effect that the crystal c-axes in the first and second magnetic layers 22a and 22b formed near the junction wall faces 10a and 10b on both sides of the reader stack are oriented along the ABS and in the direction almost perpendicular to the junction wall faces 10a and 10b. That is, the c-axes near the junction wall faces are aligned one-dimensionally ($1D_1$ and $1D_2$), and it makes the bias magnetic field effectively condensed to the free layer 16. The one-dimensional ($1D_1$ and $1D_2$) magnetic layer portions extend over the width $w_A$ of the AFM layer 13. On the other hand, the c-axes in the second magnetic layer 22b in the field regions 22 apart from the junction wall faces 10a and 10b on both sides of the reader stack are two-dimensionally (2D) random. Although it is considered that the OR of the second magnetic layer 22b in the regions apart from the junction wall faces 10a and 10b is slightly increased by oblique incidence (>50 degrees) film formation of the first seed layer and the underlayer, it is not always caused by the oblique film formation of the magnetic layer.

<Second Embodiment>

Figure 10:
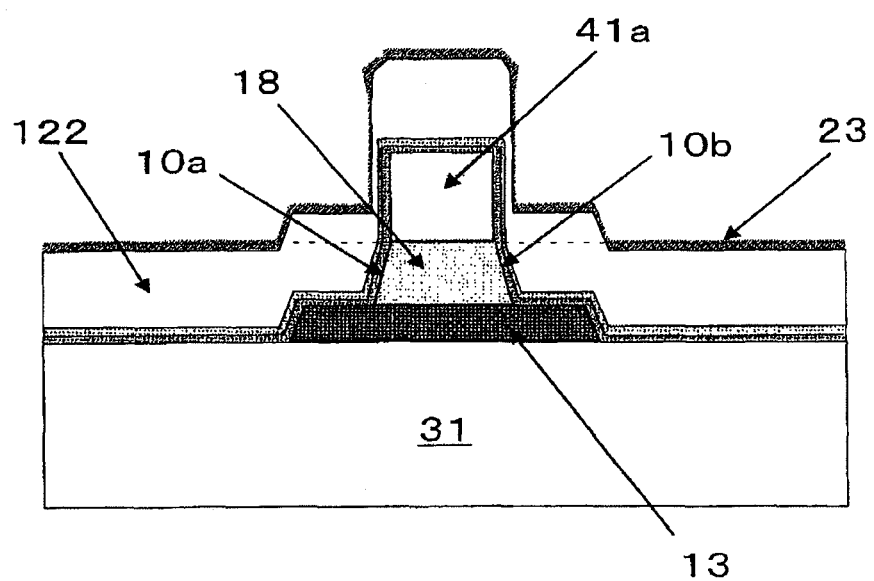
FIG. 10 is an outline drawing of procedure corresponding to FIGS. 5B and 5C in the first embodiment.
Figure 11:
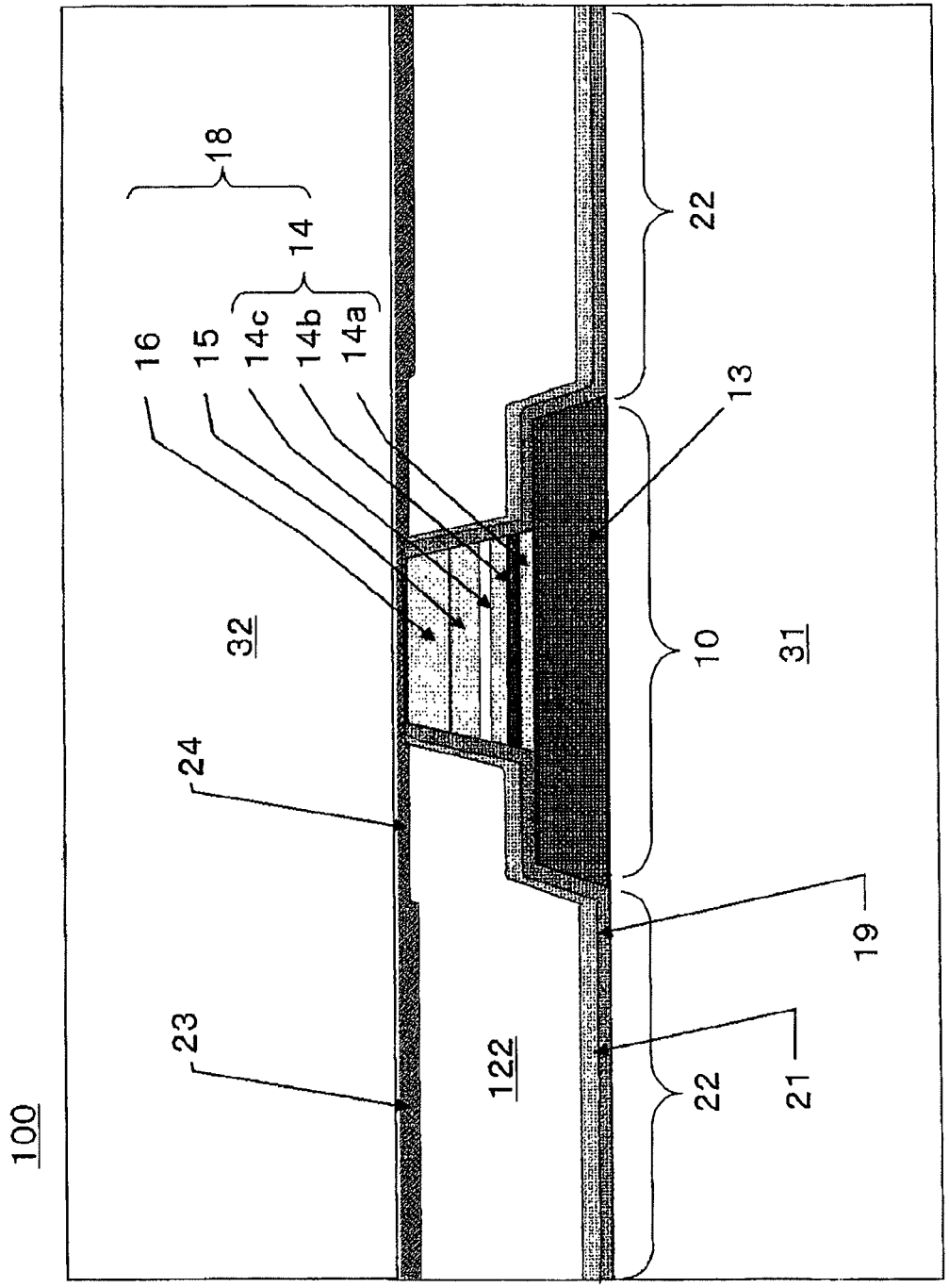
FIG. 11 is an outline drawing showing a complete form of a magnetic sensor stack body according to a second embodiment.

Next, with reference to FIGS. 10 and 11, a magnetic sensor stack body 100 of a second embodiment and a method of farming the same will be described. FIG. 10 is an outline drawing of procedure corresponding to FIGS. 5B and 5C in the first embodiment. FIG. 11 is an outline drawing showing a complete form of a magnetic sensor stack body according to the second embodiment. The same reference numerals are designated to members having the same configurations as those of the first embodiment.

The hard bias stack body 20 in FIG. 10 is formed by the conventional film forming method, that is, at an angle almost perpendicular to the face of the substrate 31. A magnetic layer 122 is formed so as to be projected from the FM stack 18 above the wide AFM layer 13. A part of the hard bias stack body 20 above the broken line in FIG. 10 is removed by a planarization process.

To prevent the magnetic layer 122 from being exposed to air after the planarization process, preferably, the operation is performed by a not-shown integral perfect-vacuum film forming apparatus. The film forming apparatus has a central vacuum module including a robot for processing wafers, and the central vacuum module is provided with modules of BE and PVD.

The planarization process is executed by performing etching at an acute angle while turning the substrate 31. After that, the exposed magnetic layer 122 and the FM stack L8 are covered with the second capping layer 24 in the PVD module. The second capping layer 24 functions as a protection layer and also functions as a seed layer for stacking the top shield layer 32. The planarization process may include a CMP process. Before formation of the second capping layer 24 and the top shield layer 32, the oxidized surface of the magnetic layer 122 may be etched.

As shown in FIG. 11, in a manner similar to the first embodiment, the reader stack 10 of the embodiment has the FM stack 18 on a part of the AFM layer 13, and the width $w_F$ of the uppermost face of the FM stack 18 along the direction in which the junction wall faces 10a and 10b are opposed to each other is set to be smaller than width $w_A$ of the uppermost face of the AFM layer 13 in the same direction. That is, the reader stack 10 is formed, for example, in a stepwise form such that the trapezoidal FM stack 18 narrower than the trapezoidal AFM layer 13 whose section is wide is stacked on the AFM layer 13.

In the embodiment, the c-axes in the magnetic layers 122 near the junction wall faces 10a and 10b are oriented along the ABS. That is, the c-axes in the magnetic layers 122 near the junction wall faces 10a and 10b are almost perpendicular to the junction wall faces 10a and 10b of the AFM layer 13 and the FM stack 18, aligned one-dimensionally (1D), and effectively make the bias magnetic fields condensed to the free layer 16. The one-dimensional (1D) magnetic layer portion extends over the width $w_A$ of the AFM layer 13. On the other hand, the c-axes in the magnetic layer 122 in the field regions 22 apart from the junction wall faces 10a and 10b are two-dimensionally (2D) random. Therefore, the magnetic sensor stack body 100 in the embodiment basically produces the operation and effect similar to those of the first embodiment.

<Third Embodiment>

[Structure of Magnetic Sensor Stack Body]

Figure 12:
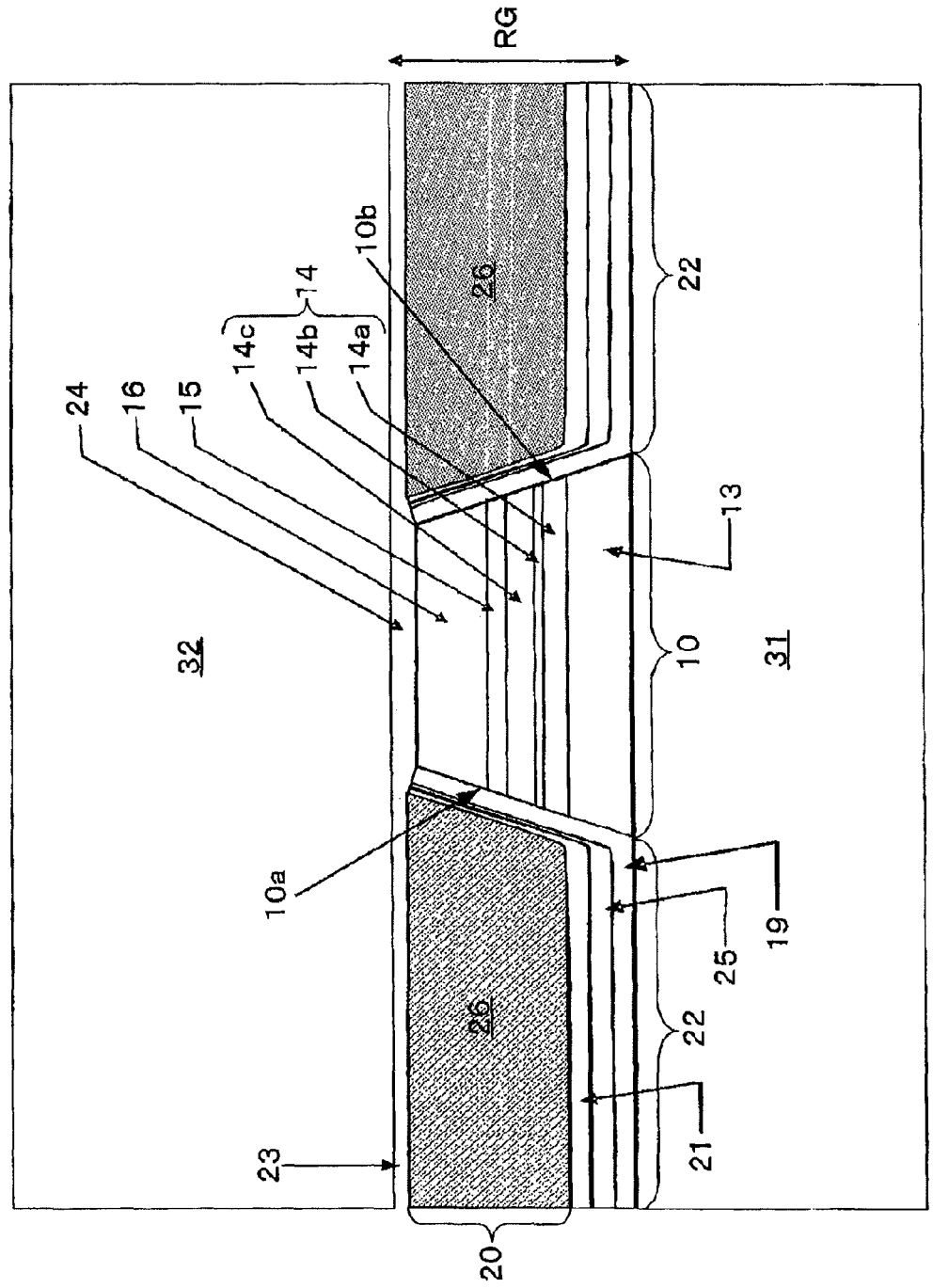
FIG. 12 is an outline drawing schematically showing a magnetic sensor stack body according to a third embodiment.
Figure 13:
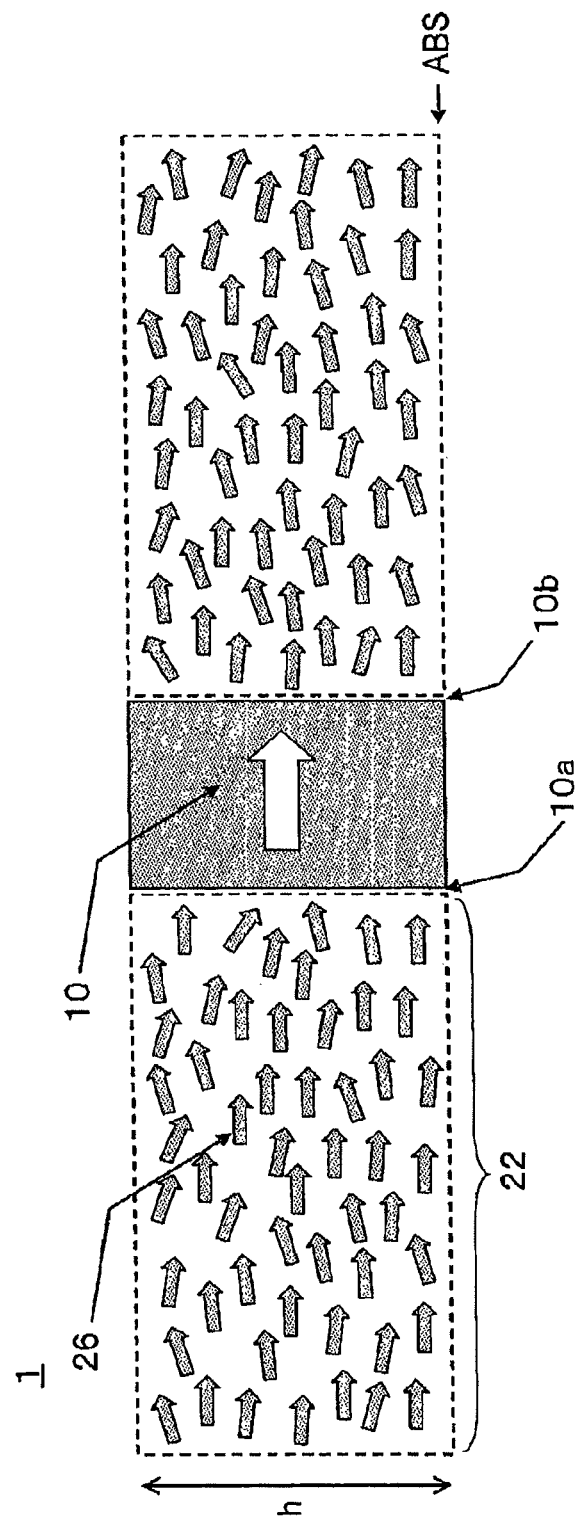
FIG. 13 is an outline drawing showing a profile perpendicular to the stack direction of the magnetic sensor stack body according to the third embodiment.

First, with reference to FIGS. 12 and 13, the structure of a magnetic sensor stack body having a magnetoresistive element will be described. FIG. 12 is an outline drawing schematically showing a magnetic sensor stack body according to a third embodiment. FIG. 13 is an outline drawing showing a profile perpendicular to the stack direction of the magnetic sensor stack body according to the third embodiment.

As shown in FIG. 12, the magnetic sensor stack body 1 according to the embodiment has, in an almost center portion of the substrate 31, a magnetoresistive element (reader stack) 10 made of a plurality of stack films of different compositions and having a magnetoresistive effect that the electric resistance value fluctuates when a magnetic field is applied. The magnetic sensor stack body 1 has, in the field regions 22 on sides of the two opposed junction wall faces 10a and 10b of the reader stack 10, the hard bias stack body 20 for applying the bias magnetic field to the reader stack 10. As described above, the magnetic sensor stack body 1 has, on the substrate 31, one or plural reader stacks 10 and the hard bias stack body 20, and is an interim product before sensors for magnetic read head such as a hard disk drive (HDD) are cut.

The reader stack 10 illustrated in FIG. 12 is a magnetic tunnel junction (MTJ) body having an oxide barrier layer (MgO) just below the free layer 16. The present invention is not limited to the MTJ body and the reader stack 10 may be a giant magnetoresistive junction (GMR) body of a current perpendicular to plane (CPP) type having low resistance.

Concretely, the reader stack 10 is, for example, stacked on the bottom shield layer (substrate) 31 made of a soft magnetic material such as NiFe and has mainly the antiferromagnetic pinning layer (AFM layer) 13, the synthetic antiferromagnetic layer (SAF layer) 14, the spacer layer 15, and the ferromagnetic free layer 16.

The AFM layer 13 is made of, for example, an antiferromagnetic material such as IrMn. The AFM layer 13 is stacked, for example, on the bottom shield layer 31, as necessary, via a not-shown pre-seed layer (11 in FIG. 14) made of Ta or the like and a third seed layer (12 in FIG. 14) made of Ru or the like.

The SAF layer 14 is made by two ferromagnetic layers 14a and 14c coupled in opposite directions via the thin coupling layer (a nonmagnetic layer or a tunnel insulating layer) 14b. The ferromagnetic layers of the SAF layer 14 are a pinned layer 14a which is in contact with the AFM layer 13 and a reference layer 14c which is in contact with the coupling layer 14b.

The spacer layer 15 is a nonmagnetic layer or a tunnel insulating layer and is, for example, an oxide layer made of MgO or the like.

The free layer 16 is made of, for example, a ferromagnetic material such as CoFeB and may be a layer obtained by stacking a Ta layer or a NiFe layer on a ferromagnetic layer made of CoFeB or the like. A bias magnetic field is applied to the free layer 16, and the free layer 16 is oriented so as to form a right angle with the reference layer 14c. With the layout, sensor sensitivity can be made high and linear response to an external magnetic field from a recording medium is provided. The bias magnetic field is also called "hard bias" and expected to be maintained constant throughout the life of a disk drive. The hard bias prevents a magnetic domain from being formed in the free layer 16. A magnetic resistance change through the reader stack 10 is determined by relative directions of magnetizations of the reference layer 14c and the free layer 16.

As necessary, the free layer 16 is covered with a not-shown third capping layer (17a and 17b in FIG. 14) made of a material selected from, for example, Cr, Ru, Ta, Ti, alloys of them, C, and the like.

As described above, the hard bias stack body 20 is formed in the field region 22 on the substrate 31, and includes a magnetic layer 26 including crystal grains having crystal c-axes.

As shown in FIG. 13, in the magnetic sensor stack body 1 of the embodiment, in the field region 22 apart from the reader stack 10, the c-axes (crystal grain magnetization axes) in the magnetic layer 26 are oriented one-dimensionally (1D). The orientation of the c-axes in the magnetic layer 26 are along the ABS in the film plane and is almost perpendicular to the junction wall faces 10a and 10b.

Referring again to FIG. 12, the magnetic layer 26 is made of, for example, an alloy having a hexagonal crystal structure (hcp) selected from Co—Pt, Co—Cr—Pt and a group of alloys of Co—Pt and Co—Cr—Pt. The magnetic layer 26 is not limited to the alloy having the hexagonal crystal structure but may be formed of an alloy of a face-centered tetragonal structure (fct) selected from Fe—Pt, Co—Pt, and a group of alloys of Fe—Pt and Co—Pt.

In the embodiment, the magnetic layer 26 is stacked over the bottom shield layer 31 via at least the underlayer 21 and the insulating layer 19. The insulating layer 19 is stacked as necessary.

The insulating layer 19 is disposed in the lower part of the field region 22 and on the junction wall faces 10a and 10b of the reader stack 10. The insulating layer 19 is made of, for example, an oxide such as $Al_2O_3$ or $SiO_3$, a nitride, or the like. The insulating layer 19 has a thickness of 2 to 10 nm in the field region 22 and a thickness of 2 to 5 nm on the junction wall face.

The underlayer 21 is made of, for example, W—Ti, RuAl, Cr such as CrNb, Cr—Ti, or, Cr—Mo, Ti, Nb, Ta, W, Ru, or Al or an alloy having a body-centered cubic crystal structure (bcc) selected from an alloy group of them. The underlayer 21 has, for example, a thickness which is 3 to 8 nm in the field region and is less than 3 nm in the junction wall face.

Preferably, the underlayer 21 is formed on the insulating layer 19 via the second seed layer 25. The second seed layer 25 is made of, for example, a metal nitride such as Ta—N, Nb—N, or RuAl—N, or Co—W. The second seed layer 25 has, for example, a thickness of 3 to 8 nm in the field region and a thickness of less than 3 nm on the junction wall face.

Further, as necessary, the magnetic layer 26 is covered with the first capping layer 23 made of, for example, a material selected from Cr, Ru, Ta, Ti, a group of alloys of Cr, Ru, Ta, and Ti, and C.

The magnetic sensor stack body 1 has the bottom shield layer 31 below the insulating layer 19 and has the top shield layer 32 on the first capping layer 23. The shield layers 31 and 32 are made of, for example, a soft magnetic material such as NiFe. That is, the reader stack 10 and the hard bias stack body 20 are sandwiched between the two thick soft magnetic shield layers 31 and 32. A gap between the shield layers 31 and 32 serves as a read gap (RG).

[Method of Forming Magnetic Sensor Stack Body]

Figure 14:
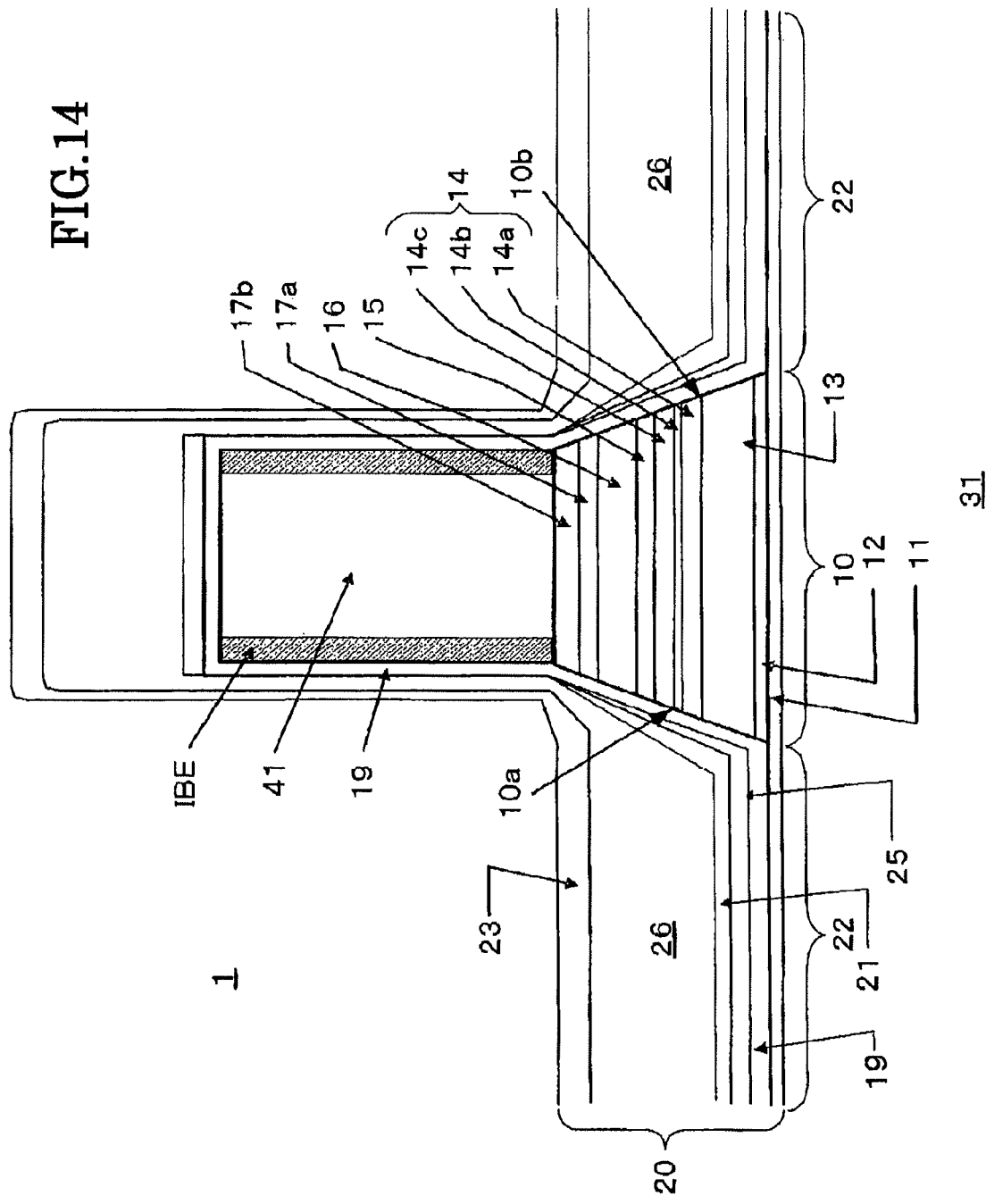
FIG. 14 is an outline drawing showing a magnetic sensor stack body in which a photoresist mask is disposed on the magnetoresistive element.
Figure 15:
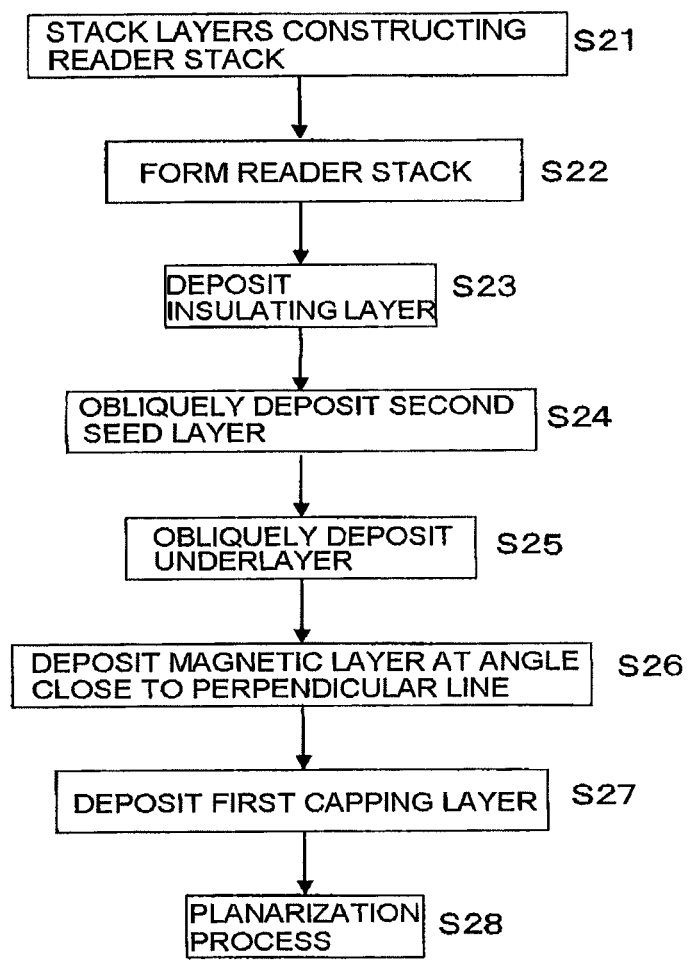
FIG. 15 is a process chart showing procedure of forming a hard bias stack body as a component of the magnetic sensor stack body of the third embodiment, in a field region.

Next, with reference to FIG. 7 and FIGS. 14 to 20, a method of forming the magnetic sensor stack body 1 according to the embodiment will be described, and the operation of the magnetic sensor stack body 1 will be also described. FIG. 14 is an outline drawing showing a magnetic sensor stack body in which a photoresist mask is disposed on the magnetoresistive element. FIG. 15 is a process chart showing procedure of forming a hard bias stack body as a component of the magnetic sensor stack body of the embodiment, in a field region.

As shown in FIGS. 14 and 15, first, on the substrate 31, a plurality of layers constructing the reader stack 10 are stacked (S21). As the substrate 31, for example, a bottom shield layer made of a soft magnetic material such as NiFe is employed. The AFM layer 13 as a component of the reader stack 10 is stacked, for example, on the bottom shield layer (substrate) 31, as necessary via a pre-seed layer 11 made of Ta or the like and a third seed layer 12 made of Ru or the like.

Next, the photoresist (PR) is applied, patterned, and developed and, after that, an etching process is performed with the photoresist mask as a mask 41 to form the reader stack 10 whose sectional shape is a trapezoid (S22). The photoresist mask 41 is used to mask a part of the reader stack 10 in the etching process. For the etching process, for example, ion beam etching (IBE) or reactive ion etching (RIE) is employed. In the case of using the RIE, a hard mask may be formed on the reader stack configuration layer. In this case, the photoresist mask 41 is initially used to form a hard mask and is removed by an oxygen ashing process or the like before the reader stack configuration layer is etched.

After the etching process, the insulating layer 19 is coated on the reader stack 10 including the photoresist mask 41 and its junction wall faces 10a and 10b (S23). For the coating of the insulating layer 19, it is preferable to use an oxide insulator (3 to 5 nm) such as $Al_2O_3$ or $SiO_2$ and, for example, a film forming method such as the physical vapor deposition (PVD), ion beam deposition (IBD), atomic layer deposition (ALD), or chemical vapor deposition (CVD) is used. The ALD and CVD have an advantage that conformal film formation is possible.

Next, the hard bias stack body 20 is formed on the insulting layer 19. In the case of the hard bias stack body 20 of the embodiment, a second seed layer 25 and the underlayer 21 are formed on the insulating layer 19 (S24 and S25), and the magnetic layer 26 and the first capping layer 23 are Formed (S26).

Concretely, first, the second seed layer 25 is obliquely formed along the directions of the junction wall faces on the insulating layer 19 at a film formation angle exceeding 45 degrees and less than 90 degrees from the normal of the substrate 31, preferably, at a film forming angle of 60 to 75 degrees (S24). The second seed layer 25 is formed by, for example, a metal nitride such as Ta—N and may be formed by reaction in treatment gas (Ar or the like) and $N_2$ atmosphere. Partial pressure of $N_2$ in this case is preferably 10 to 30%. Alternatively, the second seed layer 25 may be formed by using a nitride target.

Next, on the second seed layer 25, the underlayer 21 is obliquely formed along the directions of the junction wall faces at a film forming angle exceeding 45 degrees and less than 90 degrees from the normal of the substrate 31, preferably, at a film forming angle of 50 to 70 degrees (S25).

Figure 16:
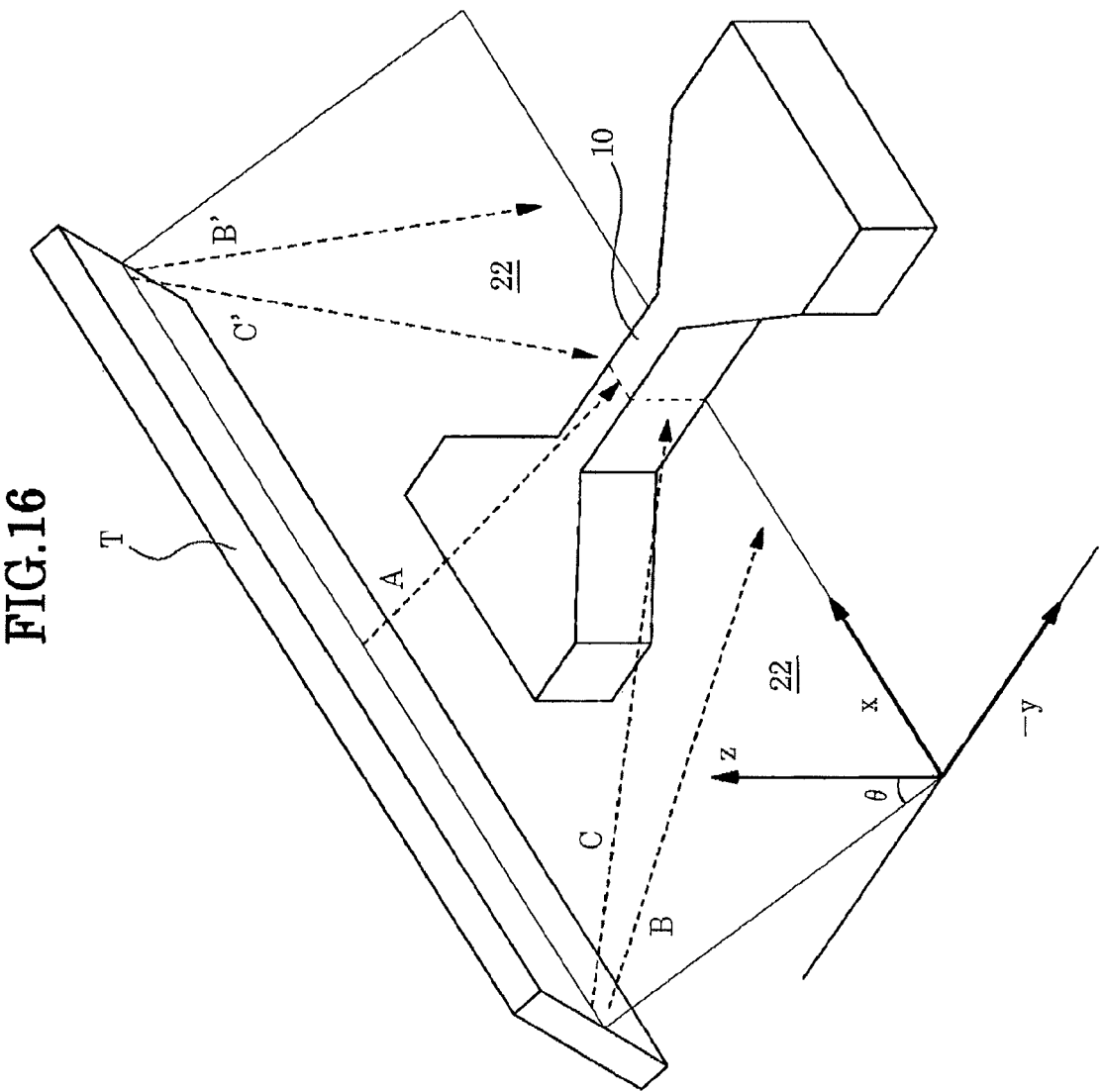
FIG. 16 is a perspective view schematically showing a film forming apparatus used for a film forming method of the third embodiment.

In the embodiment, by using a film forming apparatus as shown in FIGS. 7 and 16, oblique formation of the second seed layer 25 and the underlayer 21 is performed. FIG. 7 is an outline drawing schematically showing a film forming apparatus used for the film forming method in the embodiment. FIG. 16 is a perspective view schematically showing a film forming apparatus used for the film forming method of the embodiment.

As illustrated in FIGS. 7 and 16, the film forming apparatus 51 is, for example, an apparatus for forming a film on the substrate 31 held on the substrate holder 52 by IBD, and the slit shutter 53 is disposed forward of the target T obliquely held. The substrate holder 52 has not-shown linear moving means and can linearly move so as to be orthogonal to the slit 54 in the shutter 53. By using such a film forming apparatus 51, the substrate 31 is moved or scanned with predetermined speed under the longitudinal target T forming a right angle with respect to the drawing sheet of FIG. 7.

As shown in FIG. 16, the junction wall faces of the reader stack 10 are disposed so as to be perpendicular to the longitudinal target T. That is, the junction wall faces 10a and 10b of the reader stack 10 are along the y-axis direction in FIG. 16, and are sputter irradiated along the y-axis direction from the target T as shown by, for example, broken lines A, B, B', C, and C'.

A number of such patterns of the reader stack 10 are formed in parallel on the substrate 31. That is, a plurality of reader stacks 10 are disposed on the substrate 31, and the second seed layer 25 and the underlayer 21 are formed in the field regions 22 on both sides of each of the reader stacks 10 in the same process.

The oblique film formation by the film forming apparatus 51 is performed by two steps. Specifically, in the first step, while moving the substrate 31 at predetermined speed under the target T until a film is formed from end to end of the substrate 31, a film is obliquely formed on the junction wall faces 10a and 10b and the field regions 22. In the following second step, the substrate 31 is turned by 180 degrees and, while being moved under the target T, a film is formed on the junction wall faces 10a and 10b and the field regions 22. Although the minimum number of passage times is two, the number of passage (reciprocation) times may be increased. By forming the second seed layer 25 and the underlayer 21 in such a manner, the layers can be formed with uniform thickness.

On the underlayer 21, the magnetic layer 26 is formed at a film forming angle of 0 to 30 degrees from the normal of the substrate 31 (S26). In the embodiment, the magnetic layer 26 is formed at an angle almost perpendicular to the face of the substrate 31, so that film formation can be performed by an existing ion beam deposition (IBD) system or an ionized PVD apparatus as shown in FIG. 17. FIG. 17 is a schematic view showing an example of the IBD system.

As shown in FIG. 17, an IBD system 61 has a beam irradiation apparatus 62 for emitting an ion beam toward the target T, a rotation carousel 63 on which a plurality of targets T are mounted, and a substrate holder 64 for holding the substrate 31.

An ion beam IB from the beam irradiation apparatus 62 is extracted from a plasma source by a grid G electrically biased and directed toward the irradiation target T. By directing the beam IB at a specific angle, most of sputter particles can be deposited on the substrate 31 on the substrate holder 64.

The rotation carousel 63 has a polygonal shape (for example, hexagonal shape) and has a target mounting face 63a. On the target mounting face 63a, the target T is mounted. As the target material, for example, CoPt or the like is employed. The rotation carousel 63 rotates so that the target material to be sputtered by the ion beam IB faces the substrate 31. The size of the target mounting face 63a is usually 40 cm×30 cm.

The substrate holder 64 holds the substrate 31 by a stage 64a facing the irradiation target T on the rotation carousel 63. The substrate holder 64 can be rotated by not-shown rotating means and turns the substrate 31 during deposition in order to improve uniformity of film formation. The substrate holder 64 can change the angle of the substrate 31 with respect to incident particles from the irradiation target T by making the stage 64a inclined.

The distance from the substrate 31 to the irradiation target can be set larger than, for example, 40 cm. The longer the distance becomes, the incident particles are improved to parallel irradiation. However, a target cannot be used well, and a vacuum chamber becomes large.

Next, on the magnetic layer 26, the first capping layer 23 is formed at a film forming angle almost perpendicular to the substrate face which lies in the range of 0 to 30 degrees from the normal of the substrate 31 (S27).

As described above, the magnetic layer 26 and the first capping layer 23 are formed at an angle almost perpendicular to the substrate face, so that the layers can be formed by existing IBD, PVD, or the like as shown in FIG. 17. However, in the case of a large substrate (5 to 8 inches) 31, a problem of IB-OB (inboard-outboard) tends to occur.

Also for the magnetic layer 26 and the first capping layer 23, by reciprocate film formation using the film forming apparatus 51 as shown in FIGS. 7 and 8, the problem of IB-OB (inboard-outboard) can be solved. Concretely, as shown in FIG. 8, the substrate 31 is linearly moved at predetermined speed under the elongated target parallel to the junction wall faces of the magnetoresistive element 10, and a film is formed on one of the field regions 22. Subsequently, the substrate 31 is turned by 180 degrees around its center perpendicular axis as a center, and a film is formed on the other field region 22 while linearly moving the substrate 31 at predetermined speed under the target.

Finally, the surface of the reader stack 10 and the hard bias stack body 20 is planarized (S28) and, after that, for example, the top shield layer 32 made of a soft magnetic material such as NiFe is disposed on the first capping layer 23. That is, the reader stack 10 and the hard bias stack body 20 are sandwiched by the two thick magnetic shield layers 31 and 32.

An algorithm of the film forming method of the embodiment is installed as a film formation control program on, for example, a recording device such as a hard disk or ROM provided for a not-shown control system in the film forming apparatus 51 or the like and properly read and executed by a CPU.

The film formation control programs are follows.

11. The film formation control program for a magnetic sensor stack body having, on a substrate, a magnetoresistive element whose electric resistance fluctuates when a bias magnetic field is applied and, in field regions on sides of opposed two junction wall faces of the magnetoresistive element, forming a hard bias stack body for applying a bias magnetic field to the element, the program for making a film forming apparatus for forming the magnetic sensor stack body execute at least:

a step of obliquely forming an underlayer along a direction of the junction wall faces at a film forming angle exceeding 45 degrees and less than 90 degrees from a normal of the substrate; and a step of forming a magnetic layer on the underlayer at a film forming angle of 0 to 30 degrees from the normal of the substrate.

12. The film formation control program for a magnetic sensor stack body according to the above program 11, wherein in a state where junction wall faces of the magnetoresistive element on the substrate are disposed so as to be perpendicular to a target, the underlayer is obliquely formed on the junction wall faces and the field region while moving the substrate at predetermined speed under the target, the substrate is turned by 180 degrees, and the underlayer is obliquely formed on the junction wall faces and the field region while moving the substrate under the target.

13. The film formation control program for a magnetic sensor stack body according to the above program 11, further comprising a step of forming an insulating layer on the field region and the junction wall faces before the step of obliquely forming the underlayer.
14. The film formation control program for a magnetic sensor stack body according to the above program 13, further comprising a step of obliquely forming a second seed layer made of a metal nitride on the insulating layer along a direction of the junction wall faces at a film forming angle exceeding 45 degrees and less than 90 degrees from normal of the substrate after the step of forming the insulating layer.
15. The film formation control program for a magnetic sensor stack body according to the above program 14, wherein in a state where junction wall faces of the magnetoresistive element on the substrate are disposed so as to be perpendicular to a target, the second seed layer is obliquely formed on the junction wall faces and the field region while moving the substrate at predetermined speed under the target, the substrate is turned by 180 degrees, and the second seed layer is obliquely formed on the junction wall faces and the field region while moving the substrate under the target.
16. The film formation control program for a magnetic sensor stack body according to the above program 11, further comprising a step of forming a first capping layer at a film forming angle of 0 to 30 degrees from normal of the substrate after the step of forming the magnetic layer.
17. The film formation control program for a magnetic sensor stack body according to the above program 16, further comprising a step of forming a shield layer after the step of forming the first capping layer.
18. The film formation control program for a magnetic sensor stack body according to the above program 16, wherein the magnetic layer and the first capping layer are formed on one of field regions while linearly moving the substrate at predetermined speed under a target parallel to junction wall faces of the magnetoresistive element, the substrate is turned by 180 degrees around its center perpendicular axis as a center, and the layers are formed on the other field region while linearly moving the substrate at predetermined speed under the target.
19. The film formation control program for a magnetic sensor stack body according to the above program 14, further comprising a step of trimming the second seed layer and the underlayer on a thicker side on the junction wall face at an angle exceeding 60 degrees and less than 90 degrees from a normal of the substrate, before the step of forming the magnetic layer.
20. The film formation control program for a magnetic sensor stack body according to the above program 13, wherein a film forming apparatus for forming the magnetic sensor stack body is a continuous processor comprising:

a load lock module for loading/ejecting a substrate between vacuum space and atmosphere;

a conveyance chamber having a conveying mechanism;

an etching process chamber for performing an etching process;

a film forming chamber for forming the insulating layer; and an oblique film formation chamber for performing an incidence control type sputtering process, and the steps are continuously performed under vacuum atmosphere of the continuous processor.
21. The film formation control program for a magnetic sensor stack body according to the above program 20, wherein the continuous processor has a film forming chamber for forming a film by ion beam deposition or ionized physical vapor deposition.

A recording medium is a computer-readable portable recording medium. The film formation control program recorded on the recording medium is installed on the storage device. Examples of the recording medium include flash memories such as compact flash (registered trademark), SmartMedia (registered trademark), memory stick (registered trademark), multimedia card, and SD memory card, removable hard disks such as micro drive (registered trademark), magnetic recording media such as floppy disk (registered trademark), magnetooptic recording media such as MO, and optical disks such as CD-R, DVD-R, DVD+R, DVD-RAM, DVD+RW (registered trademark), and PD.

FIGS. 18A to 18E are outline drawings showing a layer configuration of the hard bias stack body and a magnetization loop of the hard bias stack body. FIG. 18A shows the layer configuration of the hard bias stack body made of, from above, the first capping layer 23 (WTi) 3 nm, the magnetic layer 26 (CoPt) 20 nm, the underlayer 21 (WTi) 4 nm, the second seed layer 25 (Ta—N) 3, 4, 5 nm, and a thermally-oxidized film or the substrate 31 (Si). FIG. 18B corresponds to the two-dimensional isotropic CoPt magnetic layer 26 on the underlayer 21 (WTi) 8 nm and the substrate 31 (SiO$_2$). FIGS. 18C to 18E show magnetization loops of the CoPt hard bias film having a thickness of 20 nm of an orientation type on WTi/TaN shown in FIG. 18A. The thickness of the magnetic layer 26 is 10 to 30 nm.

As shown in FIGS. 18C to 18E, OR increases with thickness t1 (Ta—N) of the second seed layer 25, and slightly high Hc is observed when t1=4 nm. It should be noted that the total thickness of the second seed layer 25 and the underlayer 21 is less than 10 nm and, even when the magnetic layer 26 is formed at an angle almost perpendicular to the substrate face, the quadrature shape improves. A high coercive force orientation ratio (OR value) whose actual measurement value is 1.6 exceeding 1.5 and a squareness ratio whose actual measurement value is about 0.95 exceeding 0.9 are observed when t1=4 nm and 5 nm. When the magnetization easy axis is measured in a film having magnetic anisotropy, usually, the squareness ratio comes close to 1 and, on the other hand, the squareness ratio on the magnetization difficult axis side becomes lower.

In the embodiment, it was found out that the best result of OR>1 at a value of a specially smaller thickness is obtained in the underlayer 21 of W—Ti having a Ti composition ratio of 10 atomic %<Ti<30 atomic %, preferably, 10 atomic %.

Actually, when a Cr alloy such as CrTi and CrMo is used as the second seed layer 25, OR or coercive force Hc decreases remarkably. On the other hand, in the case of CrNb (the composition ratio of Nb is about 30 atomic %), as the applications of a medium are reported by Shibamoto et al., OR is larger than 1, and a magnetic loop shape almost the same as that of FIG. 18B is expressed.

Figure 19:
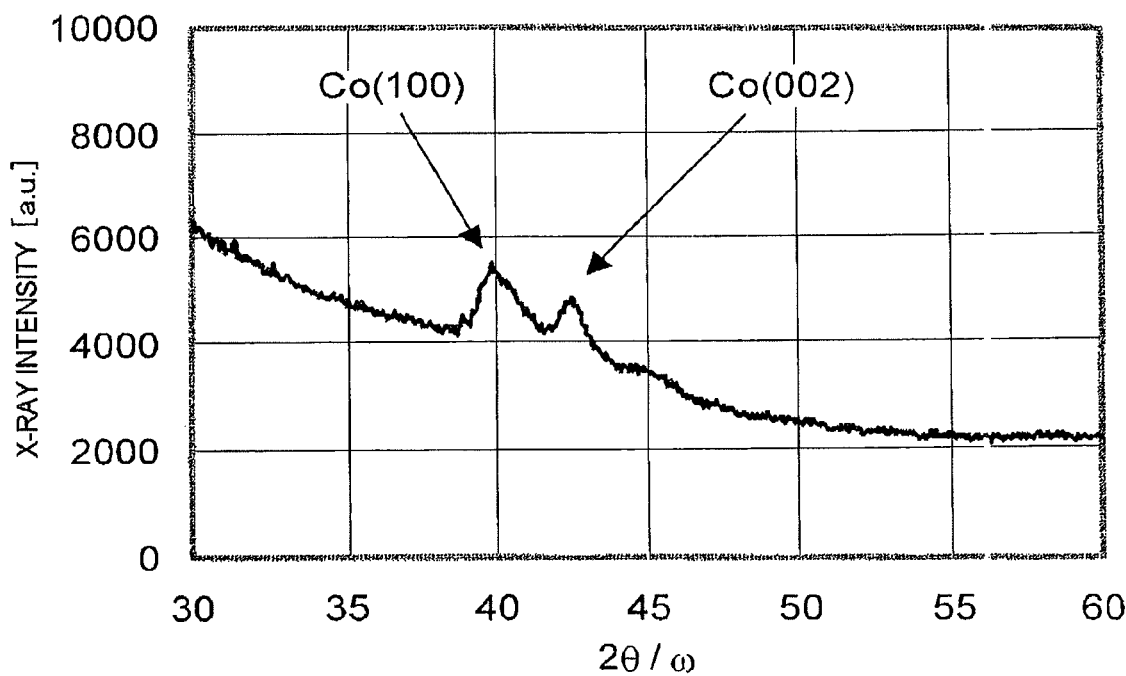
FIG. 19 is an explanatory diagram showing an XRD spectrum in a CoPt magnetic layer deposited over a second seed layer of Ta—N and an underlayer of W—Ti.

Next, crystal growth in the film forming method of the embodiment will be examined by using XRD (X-ray diffractiometer) measurement data or the like. FIG. 19 is an explanatory diagram showing an XRD spectrum in the CoPt magnetic layer 26 deposited over the second seed layer 25 of Ta—N and the underlayer 21 of W—Ti. The layer configuration of the hard bias stack body 20 is made of, from above, the first capping layer 23, the magnetic layer 26 (CoPt) 20 nm, the uncle/layer 21 (WTi) 5 nm, the second seed layer 25 (Ta—N) 5 nm, and a thermally-oxidized film or the substrate 31 (Si). The second seed layer 25 (Ta—N) is obliquely formed along the directions of the junction wall faces at a film forming angle of 70 degrees. The underlayer 21 (WTi) is obliquely formed along the directions of the junction wall faces at a film forming angle of 60 degrees. The magnetic layer 26 (CoPt) is formed at an angle almost perpendicular to the substrate surface 31.

From the XRD data of FIG. 19, it is understood that even when the second seed layer 25 and the underlayer 21 are obliquely formed and the magnetic layer (CoPt) 26 is formed at an angle which is almost perpendicular, the c-axes in the magnetic layer 26 are one-dimensionally (1D) oriented along the ABS in the film plane. It can be determined since the peak of Co (100) can be recognized in the XRD data.

Figure 20:
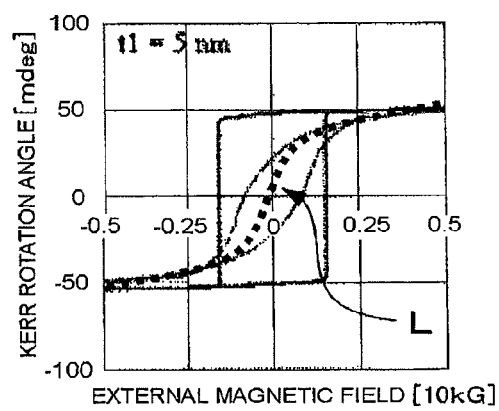
FIG. 20 is an explanatory diagram showing a reason why orientation in a direction perpendicular to a substrate is not obtained.

On the other hand, although the peak of Co (002) in FIG. 19 indicates orientation in the substrate perpendicular direction, it appears from the characteristics of measurement. By recognizing hysteresis loops in FIGS. 18C and 18D, it is understood that there is no orientation in the direction perpendicular to the substrate. In the case where orientation in the substrate perpendicular direction is expressed, a hysteresis loop as shown by a dotted line L in FIG. 20 is expressed.

As described above, according to the embodiment, by optimizing the material, thickness, and sputter incident angle of the second seed layer 25 and the underground layer 21, the magnetic anisotropy of the magnetic layer 26 can be increased. As described above, the magnetic layer 26 formed over the second seed layer 25 and the underlayer 21 is made of the Co—Pt-based alloy having the hexagonal crystal structure (hcp), and no gaps exist in the layer. The magnetic layer 26 has the (10.0) lattice plane, the c-axes in the magnetic layer 26 are oriented one-dimensionally (1D) along the ABS in the face of the magnetic layer 26, and the magnetic layer 26 has a squareness ratio exceeding 0.9. That is, since the c-axes in the magnetic layer 26 are oriented in a direction almost perpendicular to the junction wall face in the face of the magnetic layer 26, the magnetic flux can be condensed to the reader stack 10.

<Fourth Embodiment>

Figure 21:
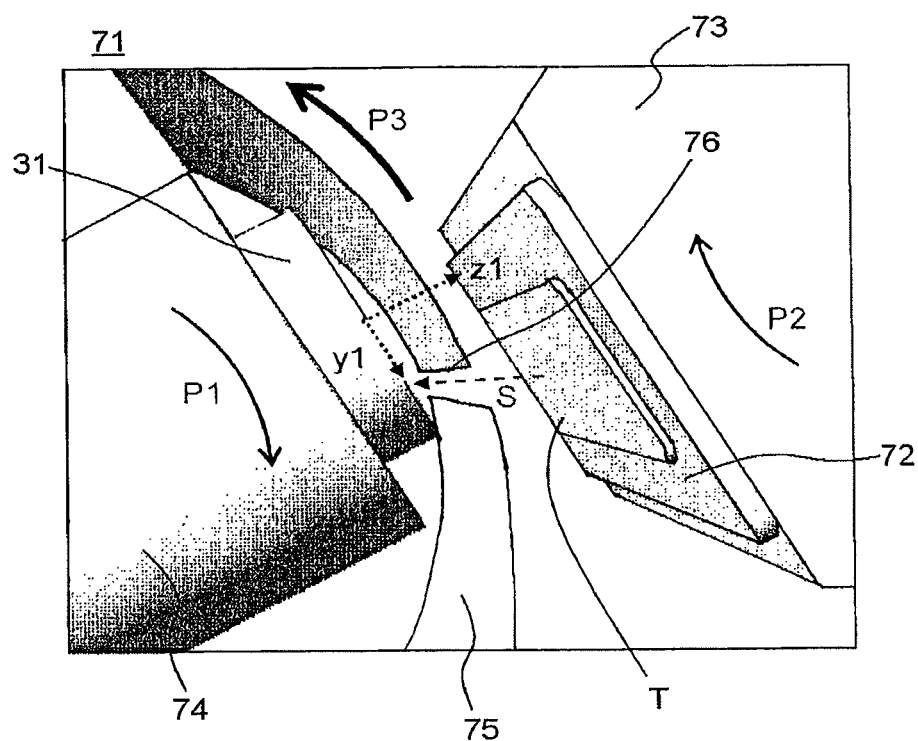
FIG. 21 is an outline drawing schematically showing a film forming apparatus of a fourth embodiment.

Next, with reference to FIG. 21, a film forming apparatus used for a film forming method of a fourth embodiment will be described. FIG. 21 is an outline drawing schematically showing the film forming apparatus of the fourth embodiment. The same reference numerals are designated to members having the same configurations as those of the third embodiment.

As shown in FIG. 21, a film forming apparatus 71 of the embodiment has a target holder 72 for holding a target. T, a cathode 73 having the target holder 72 at its front face, and a substrate holder 74 for holding the substrate 31. Further, the film forming apparatus 71 has a shutter 75 having an arc-shaped section between the target T and the substrate 31, and the shutter 75 has a slit 76.

The substrate holder 74 has a not-shown swing axis parallel to the longitudinal direction of the target T at a rear end side, and the substrate 31 is turned (P1) around the axis during the film forming process. Further, the substrate holder 74 is turnable around the z1 axis as a center.

The cathode 73 has a not-shown swing shaft parallel to the longitudinal direction of the target T at a rear end side, and the target T is turned (P2) around the axis during the film forming process. The direction of turn (P1) of the substrate 31 and that of turn (P2) of the target T are opposite to each other.

The shutter 75 is turned (P3) along its circumferential direction and can close the slit 76 before and after the film forming process.

Figure 22:
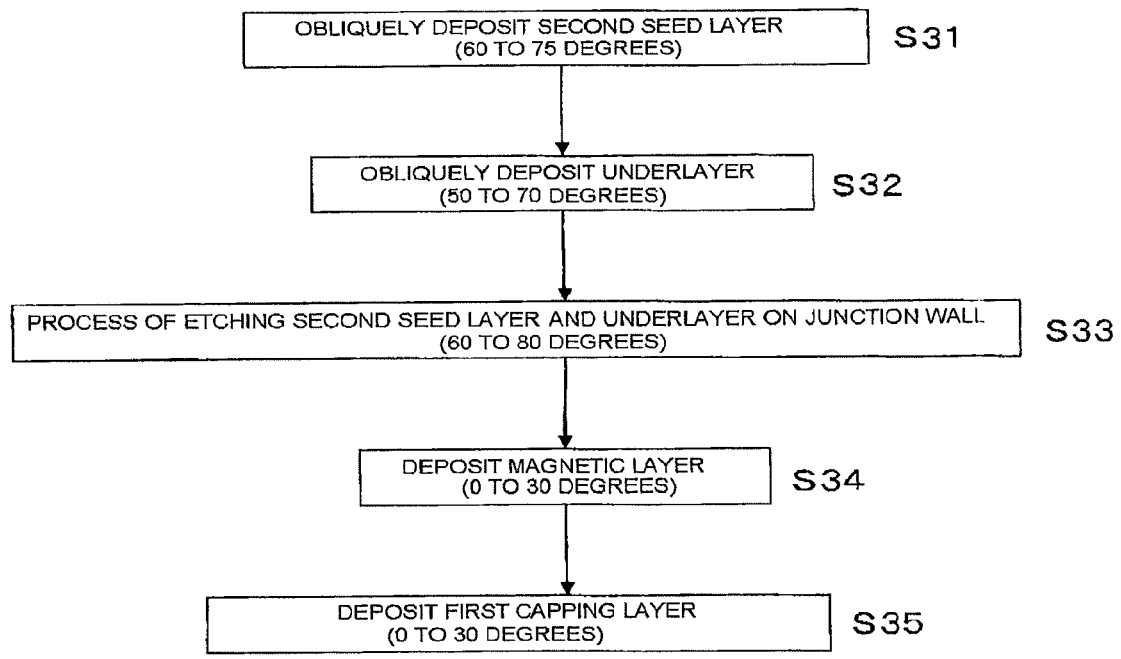
FIG. 22 is a process chart showing procedure of forming a hard bias stack body in a field region in a film forming method of the fourth embodiment.
Figure 23B:
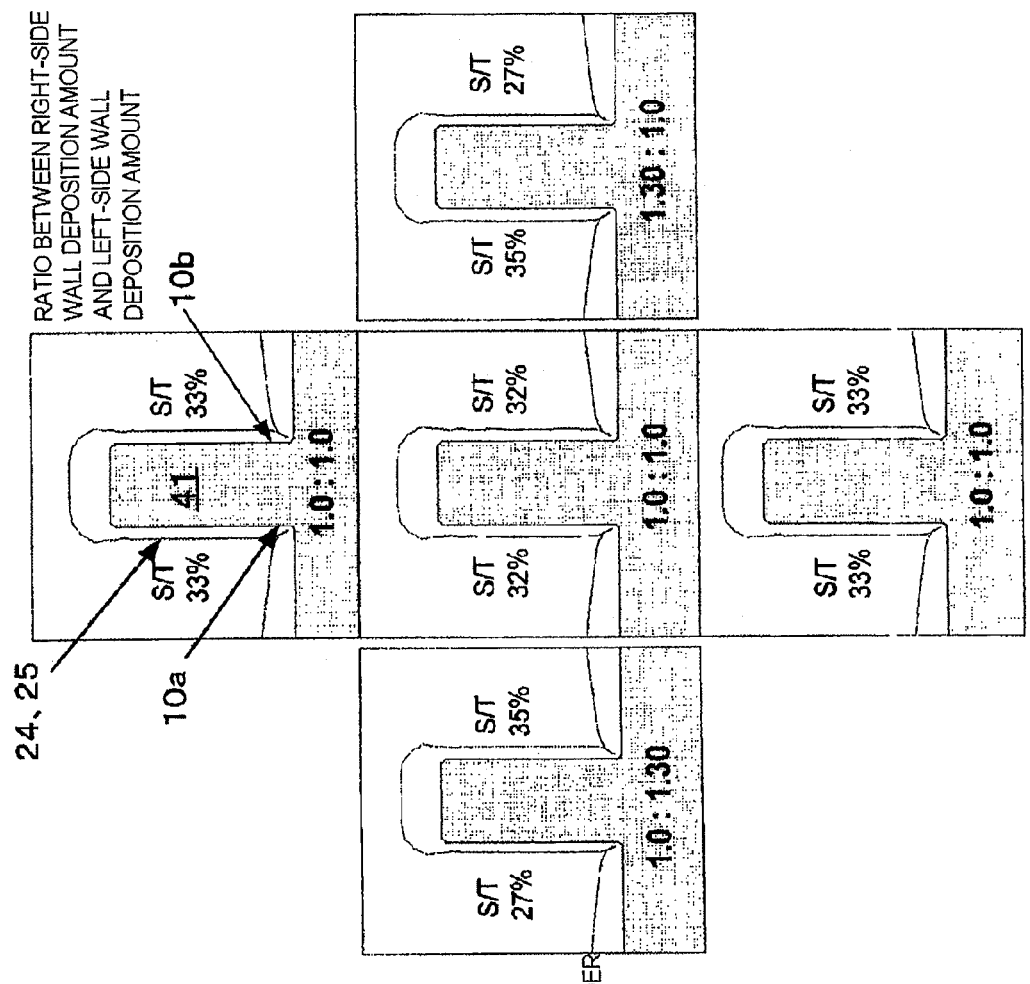
FIGS. 23A and 23B are explanatory diagrams showing a film depositing state in the case of using the film forming apparatus of the fourth embodiment.
Figure 23A:
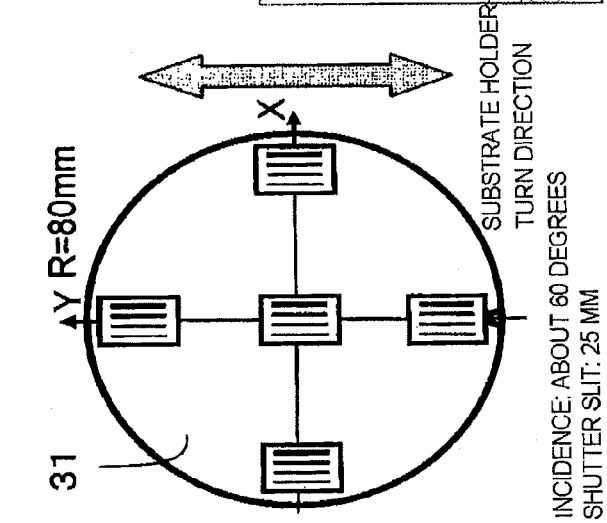
Figure 24:
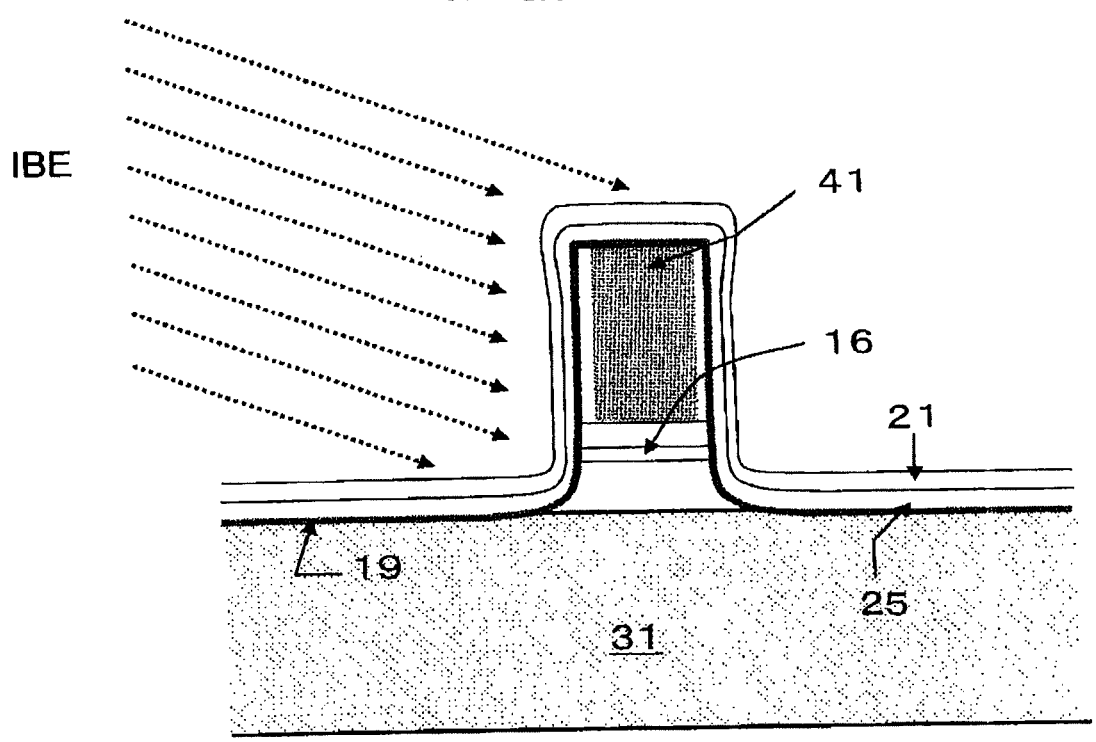
FIG. 24 is an explanatory diagram showing a trimming procedure in the film forming method of the fourth embodiment.

Next, the method of forming the magnetic sensor stack body 1 of the embodiment will be described. FIG. 22 is a process chart showing procedure of forming a hard bias stack body in a field region in a film forming method of the fourth embodiment. FIGS. 23A and 23B are explanatory diagrams showing a film depositing state in the case of using the film forming apparatus of the fourth embodiment. FIG. 24 is an explanatory diagram showing a trimming procedure in the film forming method of the fourth embodiment.

As shown in FIGS. 22 and 23, in a concrete procedure of a step of forming the hard bias stack body 20 on the field region 22, first, by using the film forming apparatus 71, the second seed layer 25 is obliquely formed along the directions of the junction wall faces at a film forming angle exceeding 45 degrees and less than 90 degrees from the normal of the substrate 31, preferably, a film forming angle of 60 to 75 degrees (S31). Although the substrate 31 and the target T are turned in opposite directions in the film forming process, the substrate 31 is not turned during the turning. After one path of the film forming process, the substrate 31 is turned by 180° along the z1 axis, and is turned again. The one path may be used in the case where the angle of forming the sputter particles S on the substrate 31 changes from θ to −θ.

Next, by using the film forming apparatus 71, the underlayer 21 is obliquely formed along the directions of the junction wall faces at a film forming angle exceeding 45 degrees and less than 90 degrees from the normal of the substrate, preferably, a film forming angle of 50 to 70 degrees (S32). In this case as well, after one path of the film forming process, the substrate 31 is turned by 180° along the z1 axis and is turned again.

When films are formed by the film forming apparatus 71 using the longitudinal target T, there is the possibility that the film thickness difference between both sides of the junction wall faces 10a and 10b becomes conspicuous. FIG. 23B shows a calculated profile of a pattern on an 8-inch substrate 33. The target T has a length of 450 nm, and the distance between the target T and the substrate 31 is 100 mm. The film thickness on the junction wall faces 10a and 10b is about 35% of that on the field region 22 apart from the wall faces. For example, when the total thickness of the second seed layer 25 and the underlayer 21 is 10 nm, the thickness is 3.5 nm. When the thickness of the insulting layer 19 of 3 to 5 nm is added, the distance between the magnetic layer 26 and the reader stack 10 becomes about twice. It deteriorates the magnetic field bias efficiency. To reduce the film thickness difference between the junction wall faces 10a and 10b, it is preferable to trim the thicker side of the second seed layer 25 and the underlayer 21 on the junction wall faces 10a and 10b by IBE as shown in FIG. 24. By acute-angle etching, the films on the junction wall faces 10a and 10b can be selectively etched more than the films on the field region 22.

That is, as shown in FIG. 23B, in the direction orthogonal to the turn direction, variation occurs in the thicknesses on both sides of the junction wall faces (1.0:1.30 or 1.30:1.0). Consequently, as shown in FIG. 24, the second seed layer 25 and the underlayer 21 on the thick side of the junction wall face are trimmed by ion beam etching (IBE) at the film forming angle exceeding 60 degrees and less than 90 degrees, preferably, 80 degrees or less from the normal of the substrate 31 so that the thicknesses on both sides become equal (S33).

After that, the magnetic layer 26 is formed at a film forming angle almost perpendicular to the surface of the substrate 31 at a film forming angle 0 to 30 degrees from the normal of the substrate 31 (S34). The film forming apparatus 71 can be also used for forming the magnetic layer 26. In the case where a problem of IB-OB (inboard-outboard) does not occur, a film is formed at an angle almost perpendicular to the surface of the substrate 31. In the case where the surface of the underlayer 21 can be held in vacuum atmosphere, the magnetic layer 26 may be formed in another chamber such as an IBD module or an ionized PVD module (refer to the third embodiment).

Finally, the first capping layer 23 is formed at a film forming angle almost perpendicular to the surface of the substrate 31 at 0 to 30 degrees from the normal of the substrate 31 (S35).

An algorithm of the film forming method in the embodiment is installed as a film formation control program on, for example, a recording device such as a hard disk, a ROM, or the like provided for a not-shown control system in the film forming apparatus 71 and properly read and executed by a CPU.

A recording medium is a computer-readable portable recording medium. The film formation control program recorded on the recording medium is installed on the storage device. Examples of the recording medium are as described in the third embodiment.

The film forming method of the embodiment produces basically the same operations and effects as those of the third embodiment. In particular, in the fourth embodiment, since the step of performing the IBE process is added, the number of steps increases. However, a peculiar effect such that the thickness of the second seed layer 25 and the underlayer 21 can be controlled is produced.

<Fifth Embodiment>

Figure 25:
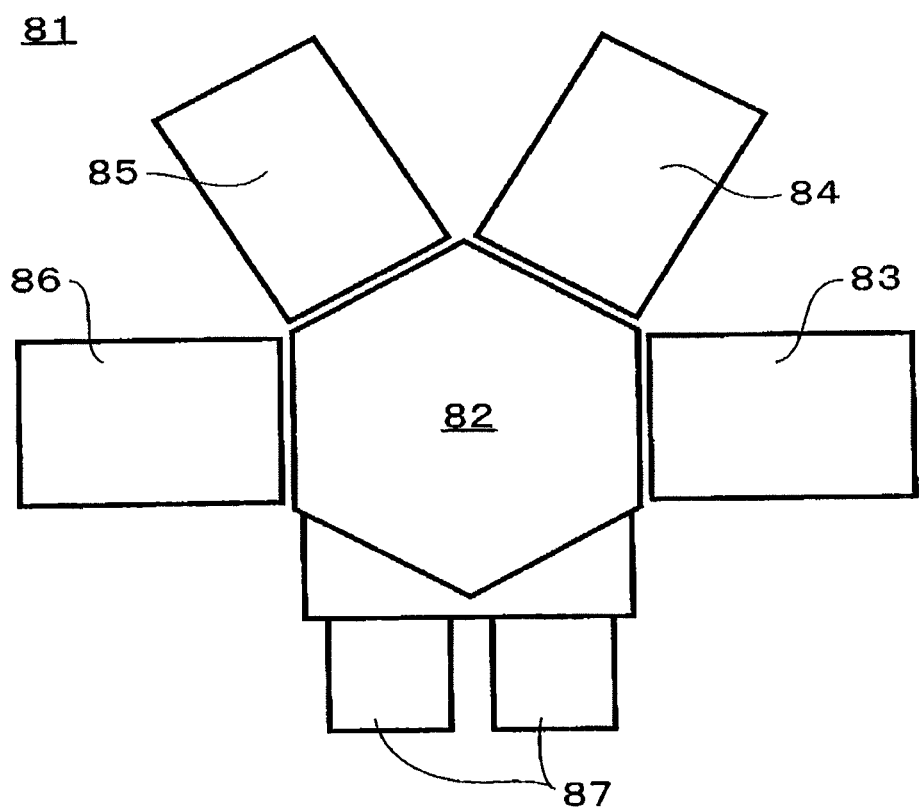
FIG. 25 is a plan view showing an example of the configuration of a continuous processor of a fifth embodiment.
Figure 26:
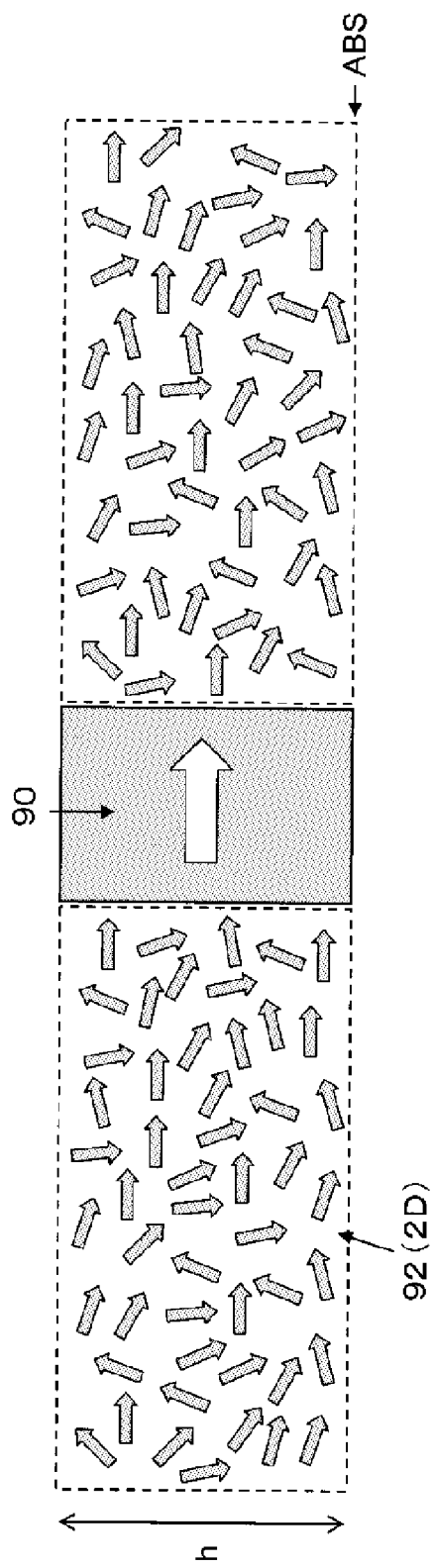
FIG. 26 is an outline drawing showing a section in a direction perpendicular to a stack direction of a conventional magnetic sensor stack body.
Figure 27:
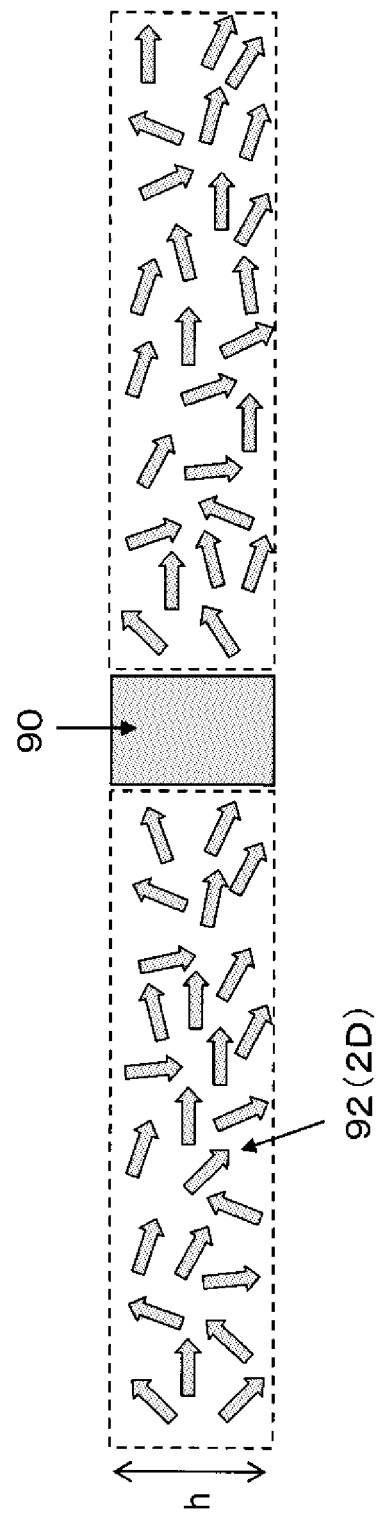
FIG. 27 is an outline drawing showing a section in a direction perpendicular to the stack direction of the conventional magnetic sensor stack body.

A fifth embodiment relates to an example of applying the film forming method to a continuous processor. FIG. 25 is a plan view showing an example of the configuration of a continuous processor of the embodiment. The same reference numerals are designated to components similar to those of the third embodiment.

As shown in FIG. 25, a continuous processor 81 has, in its center, a conveyance chamber (core chamber) 82 which can be evacuated. In the conveyance chamber 82, a not-shown conveyance mechanism made by a handling robot or the like is provided. To the conveyance chamber 82, four chambers 83 to 86 are connected via not-shown gate valves. Concretely, to the conveyance chamber 82, an etching process chamber 83 for performing an ion beam etching process (IBE) and a film forming chamber 84 for forming the insulating layer 19 are connected via gate valves. Further, to the conveyance chamber 82, an oblique film forming chamber 85 for performing an incidence-control-type sputtering process (CIS) and a deposition chamber 86 for performing deposition by ion beam deposition (IBD) or ionized physical vapor deposition (iPVD) are connected via gate valves. Further, to the conveyance chamber 82, two load lock modules 87 for inserting/ejecting the substrate 31 between vacuum space and atmosphere are connected.

As shown in FIG. 25, in a concrete procedure of a process step of the continuous processor 81, first, a substrate cassette including a reader stack configuration layer and the developed photoresist 41 is loaded into the processor via the load lock module 87. A single substrate 31 is transferred to the etching process chamber 83 by the handling robot in the conveyance module 82, and the reader stack 10 is formed. After formation of the reader stack 10, the substrate 31 is transferred to the insulating layer forming chamber 84, and the insulating layer 19 is formed. By a substrate bias process, Ar etching may be slightly performed.

After formation of the insulating layer 19, the substrate 31 is transferred to the oblique film forming chamber 85, and the second seed layer 25 and the underlayer 21 are obliquely formed. The substrate 31 is transferred again to the etching process chamber 83, and the thicker side of the second seed layer 25 and the underlayer 21 of the junction wall faces 10*a* and 10*b* is trimmed by IBE.

Next, the substrate 31 is transferred to the oblique film forming chamber 85 or the IBD/iPVD chamber 86 where the magnetic layer 26 and the first capping layer 23 are formed an angle almost perpendicular to the surface of the substrate.

Finally, the substrate 31 is returned to the etching process chamber 83 where the planarization process is performed, or is transferred to the load lock module 87 on the ejection side, and the planarization process is performed by CMP or the like on the outside.

The film forming method of the embodiment produces basically the same operations and effects as those of the third embodiment. In particular, the fifth embodiment produces a peculiar effect such that continuous processes can be performed under vacuum atmosphere.

Although the preferred embodiments of the present invention have been described above, they are illustrative for explaining the present invention, and the scope of the present invention is not limited to the embodiments. The invention can be executed in various modes different from the foregoing embodiments without departing from the gist of the invention.

For example, although the film forming method by IBD has been described in the foregoing embodiments, the invention can be also applied to a film forming method such as PVD.

What is claimed is:

1. A magnetic sensor stack body comprising, on a substrate, a magnetoresistive element whose electric resistance fluctuates when a bias magnetic field is applied and, on sides of opposed junction wall faces of the magnetoresistive element, field regions including a magnetic layer for applying the bias magnetic field to the element,
    wherein the magnetoresistive element has at least a ferromagnetic stack on a part of an antiferromagnetic layer,
    wherein the ferromagnetic stack and the antiferromagnetic layer are stacked so as to form a stepwise form at both ends adjacent to opposed junction wall faces by forming the width of an uppermost face and a lowermost face of the ferromagnetic stack smaller than the width of an uppermost face of the antiferromagnetic layer, all widths being defined by the opposed junction wall faces, and
    wherein the lowermost face of the ferromagnetic stack is a face that comes in contact with the antiferromagnetic layer.

2. The magnetic sensor stack body according to claim 1, wherein the width of the uppermost face of the antiferromagnetic layer is equal to or less than 2.5 times as large as that of the uppermost face of the ferromagnetic stack.

3. The magnetic sensor stack body according to claim 1, wherein the magnetic layer is made of Co—Pt, Co—Cr—Pt, and an alloy having a hexagonal crystal structure (hcp) selected from a group of alloys of Co—Pt and Co—Cr—Pt.

4. The magnetic sensor stack body according to claim 1, wherein the magnetic layer includes first and second magnetic layers having magnetic particles having crystal c-axes,
    the first magnetic layer is disposed adjacent to the junction wall faces in the field regions, the crystal c-axes in the first magnetic layer are aligned and oriented along an ABS in a film plane,
    the second magnetic layer is disposed adjacent to the first magnetic layer in the field regions, and the crystal c-axes direction in the second magnetic layer are distributed at random in a plane.

5. The magnetic sensor stack body according to claim 4, wherein the first magnetic layer is made of Fe—Pt, Co—Pt, and an alloy having a face-centered tetragonal structure (fct) selected from a group of alloys of Fe—Pt and Co—Pt, and the second magnetic layer is made of Co—Pt, Co—Cr—Pt, and an alloy having a hexagonal crystal structure selected from a group of alloys of Co—Pt and Co—Cr—Pt.

6. The magnetic sensor stack body according to claim 1, wherein an underlayer made of Cr, Cr—Mo, Cr—Ti, Nb, Ta, W and an alloy having a body-centered cubic crystal structure (bcc) selected from a group of alloys of them is provided on the field regions and the junction wall faces, and the underlayer has a thickness which is 3 to 8 nm in the field regions and is less than 3 nm in the junction wall faces.

7. The magnetic sensor stack body according to claim 1, wherein the field regions and the junction wall faces are provided with a first seed layer selected from CrB, CrTiB, MgO, Ru, Ta, and Ti and a group of alloys of them, and the first seed layer has a thickness which is less than 1 nm in the field regions and is 0.5 to 2 nm in the junction wall faces.

8. The magnetic sensor stack body according to claim 1, wherein the field regions and the magnetoresistive element are covered with a first capping layer made of a material selected from Cr, Ru, Ta, Ti, a group of alloys of Cr, Ru, Ta, and Ti, and C.

9. The magnetic sensor stack body according to claim 8, wherein the field regions and the junction wall faces are provided with an insulating layer made of oxide or nitride, and the insulating layer has a thickness of 2 to 5 nm on the junction wall faces.

10. The magnetic sensor stack body according to claim 9, wherein two separate shield layers made of a soft magnetic material are provided below the insulating layer and on the first capping layer.

11. The magnetic sensor stack body according to claim 1, wherein a layer of the ferromagnetic stack that comes in contact with the antiferromagnetic layer and the antiferromagnetic layer are stacked so as to form a stepwise form at both ends adjacent to opposed junction wall faces.

12. A method of forming a magnetic sensor stack body having, on a substrate, a stepwise-shaped magnetoresistive element having at least a ferromagnetic stack on a part of an antiferromagnetic layer and, in field regions on sides of opposed junction wall faces of the magnetoresistive element, a hard bias stack body for applying a bias magnetic field to the element, comprising:

a step of forming the antiferromagnetic layer and the ferromagnetic stack on the substrate;

a step of forming a pattern of a photoresist mask on the ferromagnetic stack;

a step of etching a part of the ferromagnetic stack;

a step of trimming the photoresist mask in a width direction;

a step of forming the stepwise-shaped magnetoresistive element by etching the ferromagnetic stack and the antiferromagnetic layer using the trimmed photoresist mask;

a step of forming a hard bias stack body in the field region; and a step of planarizing the surface of the stepwise-shape magnetoresistive element and the hard bias stack body, wherein the ferromagnetic stack and the antiferromagnetic layer are stacked so as to form a stepwise form at both ends adjacent to opposed junction wall faces by forming the width of an uppermost face and a lowermost face of the ferromagnetic stack smaller than the width of an uppermost face of the antiferromagnetic layer, all widths being defined by the opposed junction wall faces, and wherein the lowermost face of the ferromagnetic stack is a face that comes in contact with the antiferromagnetic layer.

13. The method of forming a magnetic sensor stack body according to claim 12, wherein the step of forming the hard bias stack body comprises:

a step of forming an underlayer at a film forming angle $\Theta_1$ ($\Theta_1=0$ to 25 degrees) from the normal of the substrate;

a step of forming a first magnetic layer at a film forming angle $\Theta_2$ ($\Theta_2=50$ to 90 degrees) from the normal of the substrate;

a step of forming a second magnetic layer at a film forming angle $\Theta_3$ ($\Theta_3=0$ to 25 degrees) from the normal of the substrate; and a step of forming a first capping layer at a film forming angle $\Theta_4$ ($\Theta_4=0$ to 45 degrees) from the normal of the substrate.

14. The method of forming a magnetic sensor stack body according to claim 12, further comprising a step of forming an insulating layer before the step of forming the hard bias stack body in the field region.

15. The method of forming a magnetic sensor stack body according to claim 12, further comprising a step of forming a second capping layer after the step of planarizing the surface of the magnetoresistive element and the hard bias stack body.

16. The method of forming a magnetic sensor stack body according to claim 15, further comprising a step of forming a shield layer after the step of forming the second capping layer.

17. The method of forming a magnetic sensor stack body according to claim 13, wherein the first magnetic layer is formed on one of junction wall faces of the magnetoresistive element while linearly moving the substrate at predetermined speed under an elongated target parallel to the junction wall faces of the magnetoresistive element, the substrate is turned by 180 degrees around its center perpendicular axis as a center, and the first magnetic layer is formed on the other face of the junction wall faces while linearly moving the substrate at predetermined speed under the target.

18. The method of forming a magnetic sensor stack body according to claim 17, wherein the underlayer, the second magnetic layer, and the first capping layer are formed on one of field regions while linearly moving the substrate at predetermined speed under the target, the substrate is turned by 180 degrees around its center perpendicular axis as a center, and the layers are formed on the other field region while linearly moving the substrate at predetermined speed under the target.

19. The method of forming a magnetic sensor stack body according to claim 12, wherein the hard bias stack body is formed by ion beam deposition.

20. The method of forming a magnetic sensor stack body according to claim 12, wherein a plurality of stepwise-shaped magnetoresistive elements are formed on the substrate, and the hard bias stack bodies in the plurality of magnetoresistive elements are stacked by the same procedure.

21. A magnetic sensor stack body comprising, on a substrate, a magnetoresistive element whose electric resistance fluctuates when a bias magnetic field is applied and, on sides of opposed junction wall faces of the magnetoresistive element, field regions including a magnetic layer for applying the bias magnetic field to the element, wherein the magnetoresistive element has at least a ferromagnetic stack on a part of an antiferromagnetic layer, wherein the ferromagnetic stack and the antiferromagnetic layer are stacked so as to form a stepwise form at both ends adjacent to opposed junction wall faces by forming the width of an uppermost face and a lowermost face of the ferromagnetic stack smaller than the width of an uppermost face of the antiferromagnetic layer, all widths being defined by the opposed junction wall faces, wherein the portions in contact with the junction wall faces in the stepwise form of the magnetic layer have a corresponding stepwise shape, and wherein the lowermost face of the ferromagnetic stack is a face that comes in contact with the antiferromagnetic layer.

22. The magnetic sensor stack body according to claim 21, wherein the width of the uppermost face of the antiferromagnetic layer is equal to or less than 2.5 times as large as that of the uppermost face of the ferromagnetic stack.

23. The magnetic sensor stack body according to claim 21, wherein the magnetic layer is made of Co—Pt, Co—Cr—Pt, and an alloy having a hexagonal crystal structure (hcp) selected from a group of alloys of Co—Pt and Co—Cr—Pt.

24. The magnetic sensor stack body according to claim 21, wherein the magnetic layer includes first and second magnetic layers having magnetic particles having crystal c-axes, the first magnetic layer is disposed adjacent to the junction wall faces in the field regions, the crystal c-axes in the first magnetic layer are aligned and oriented along an ABS in a film plane, the second magnetic layer is disposed adjacent to the first magnetic layer in the field regions, and the crystal c-axes direction in the second magnetic layer are distributed at random in a plane.

25. The magnetic sensor stack body according to claim 24, wherein the first magnetic layer is made of Fe—Pt, Co—Pt, and an alloy having a face-centered tetragonal structure (fct) selected from a group of alloys of Fe—Pt and Co—Pt, and the second magnetic layer is made of Co—Pt, Co—Cr—Pt, and an alloy having a hexagonal crystal structure selected from a group of alloys of Co—Pt and Co—Cr—Pt.

26. The magnetic sensor stack body according to claim 21, wherein an underlayer made of Cr, Cr—Mo, Cr—Ti, Nb, Ta, W and an alloy having a body-centered cubic crystal structure (bcc) selected from a group of alloys of them is provided on the field regions and the junction wall faces, and the underlayer has a thickness which is 3 to 8 nm in the field regions and is less than 3 nm in the junction wall faces.

27. The magnetic sensor stack body according to claim 21, wherein the field regions and the junction wall faces are provided with a first seed layer selected from CrB, CrTiB, MgO, Ru, Ta, and Ti and a group of alloys of them, and the first seed layer has a thickness which is less than 1 nm in the field regions and is 0.5 to 2 nm in the junction wall faces.

28. The magnetic sensor stack body according to claim 21, wherein the field regions and the magnetoresistive element are covered with a first capping layer made of a material selected from Cr, Ru, Ta, Ti, a group of alloys of Cr, Ru, Ta, and Ti, and C.

29. The magnetic sensor stack body according to claim 28, wherein the field regions and the junction wall faces are provided with an insulating layer made of oxide or nitride, and the insulating layer has a thickness of 2 to 5 nm on the junction wall faces.

30. The magnetic sensor stack body according to claim 29, wherein two separate shield layers made of a soft magnetic material are provided below the insulating layer and on the first capping layer.

* * * * *